United States Patent
Tsunashima et al.

(10) Patent No.: US 6,784,508 B2
(45) Date of Patent: Aug. 31, 2004

(54) SEMICONDUCTOR DEVICE HAVING A GATE INSULATING FILM STRUCTURE INCLUDING AN INSULATING FILM CONTAINING METAL, SILICON AND OXYGEN AND MANUFACTURING METHOD THEREOF

(75) Inventors: Yoshitaka Tsunashima, Yokohama (JP); Seiji Inumiya, Yokohama (JP); Yasumasa Suizu, Oita (JP); Yoshio Ozawa, Yokohama (JP); Kiyotaka Miyano, Yokohama (JP); Masayuki Tanaka, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 18 days.

(21) Appl. No.: 09/803,265

(22) Filed: Mar. 9, 2001

(65) Prior Publication Data

US 2001/0023120 A1 Sep. 20, 2001

(30) Foreign Application Priority Data

Mar. 10, 2000 (JP) ........................................ 2000-066960

(51) Int. Cl.[7] ............................................... H01L 29/78
(52) U.S. Cl. ..................................................... 257/411
(58) Field of Search ................................ 257/406, 410, 257/411; 438/287, 585, 591

(56) References Cited

U.S. PATENT DOCUMENTS

| | | | |
|---|---|---|---|
| 5,571,734 A | | 11/1996 | Tseng et al. |
| 5,712,208 A | * | 1/1998 | Tseng et al. ................. 438/770 |
| 5,834,353 A | | 11/1998 | Wu |
| 5,876,788 A | * | 3/1999 | Bronner et al. ............... 427/81 |
| 5,963,810 A | | 10/1999 | Gardner et al. |
| 6,020,243 A | * | 2/2000 | Wallace et al. .............. 438/287 |
| 6,057,584 A | * | 5/2000 | Gardner et al. .............. 257/411 |
| 6,130,164 A | * | 10/2000 | Gardner et al. .............. 438/694 |
| 6,261,887 B1 | * | 7/2001 | Rodder ........................ 438/218 |
| 6,274,905 B1 | * | 8/2001 | Mo .............................. 257/330 |
| 6,319,730 B1 | * | 11/2001 | Ramdani et al. ................ 438/3 |
| 6,407,435 B1 | * | 6/2002 | Ma et al. ..................... 257/411 |
| 6,417,546 B2 | * | 7/2002 | Trivedi et al. .............. 257/369 |
| 6,713,846 B1 | * | 3/2004 | Senzaki ....................... 257/635 |

FOREIGN PATENT DOCUMENTS

| | | |
|---|---|---|
| JP | 3-74878 | 5/1991 |
| JP | 11-135774 | 5/1999 |

OTHER PUBLICATIONS

Copel et al., *Structure and Stability of Ultrathin Zirconium Oxide Layers on Si(001)*, Applied Physics Letters, vol. 76, No. 4 (Jan. 24, 2000), pp. 436–438.

Guo et al., *High Quality Ultra–thin (1.5 nm) $TiO_2Si_3N_4$ Gate Dielectric for Deep Sub–micron CMOS Technology*, International Electron Device Meeting 1999, Technical Digest, Session 6: Process Technology–High K Gate Dielectrics (Dec. 8, 1999).

(List continued on next page.)

Primary Examiner—Carl Whitehead, Jr.
Assistant Examiner—Jennifer M Dolan
(74) Attorney, Agent, or Firm—Frommer Lawrence & Haug LLP

(57) ABSTRACT

Claimed and disclosed is a semiconductor device including a transistor having a gate insulating film structure containing nitrogen or fluorine in a compound, such as metal silicate, containing metal, silicon and oxygen, a gate insulating film structure having a laminated structure of an amorphous metal oxide film and metal silicate film, or a gate insulating film structure having a first gate insulating film including an oxide film of a first metal element and a second gate insulating film including a metal silicate film of a second metal element.

7 Claims, 17 Drawing Sheets

OTHER PUBLICATIONS

Lee et al., *Ultrathin Hafnium Oxide with Low Leakage and Excellent Reliability for Alternative Gate Dielectric Application*, International Electron Device Meeting 1999, *Technical Digest*, Session 6: Process Technology–High K Gate Dielectrics (Dec. 8, 1999).

Luan et al., *High Quality $Ta_2O_5$ Gate Dielectrics with $T_{ox,eq}<10Å$*, International Electron Device Meeting 1999, *Technical Digest*, Session 6: Process Technology–High K Gate Dielectrics (Dec. 8, 1999).

Ma et al., *Zirconium Oxide Based Gate Dielectrics with Equivalent Oxide Thickness of Less Than 1.0 nm and Performance of Submicron MOSFET using a Nitride Gate Replacement Process*, International Electron Device Meeting 1999, *Technical Digest*, Session 6: Process Technology–High K Gate Dielectrics (Dec. 8, 1999).

Qi et al., *MOSCAP and MOSFET Characteristics Using $ZrO_2$ Date Dielectric Deposited Directly on Si*, International Electron Device Meeting 1999, *Technical Digest*, Session 6: Process Technology–High K Gate Dielectrics (Dec. 8, 1999).

* cited by examiner

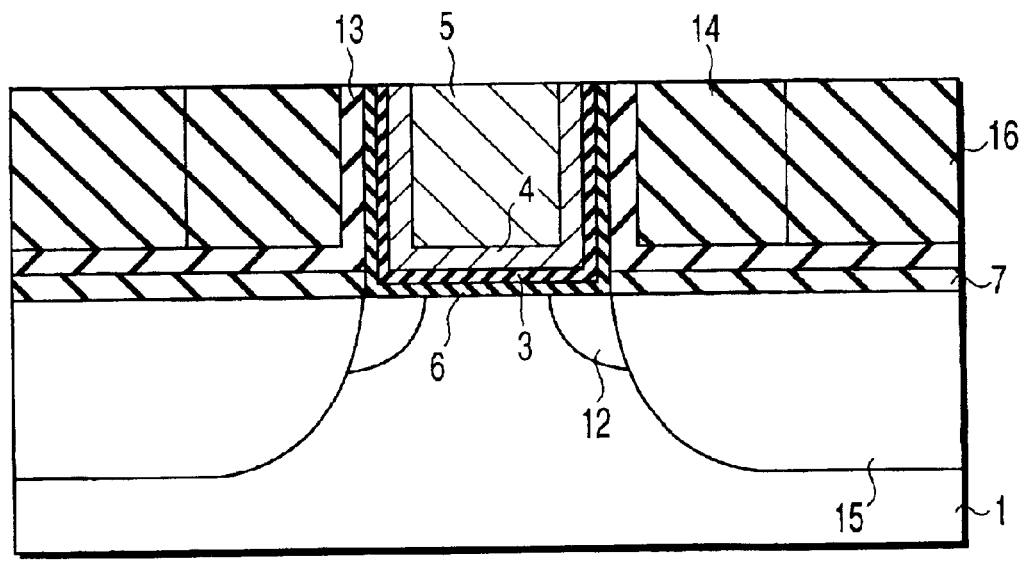
F I G. 1A
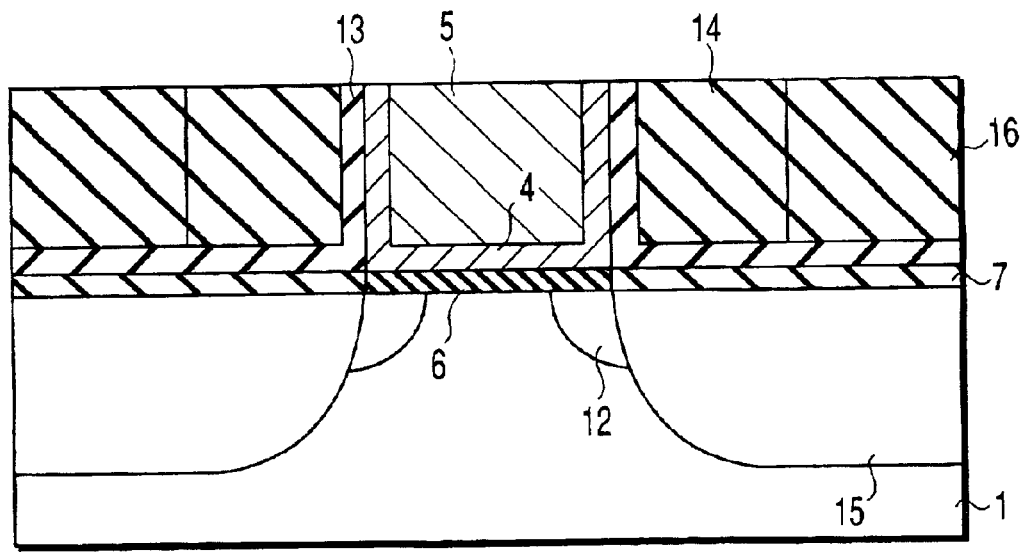
F I G. 1B

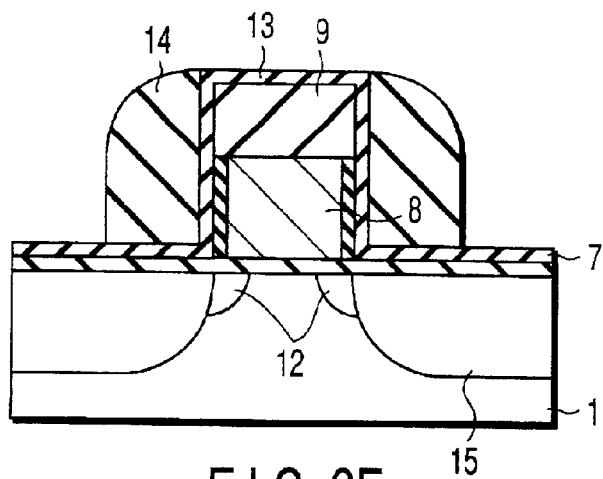
F I G. 2E
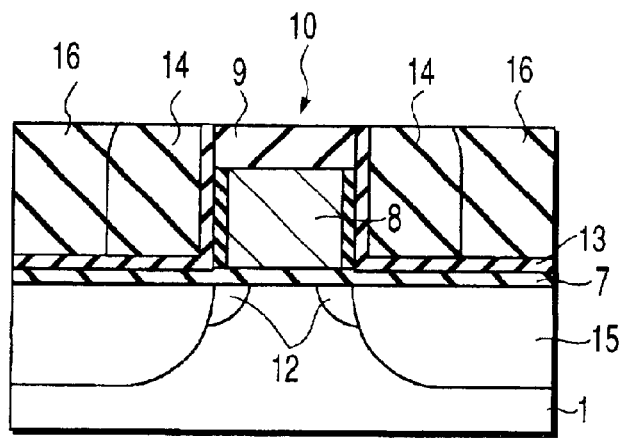
F I G. 2F
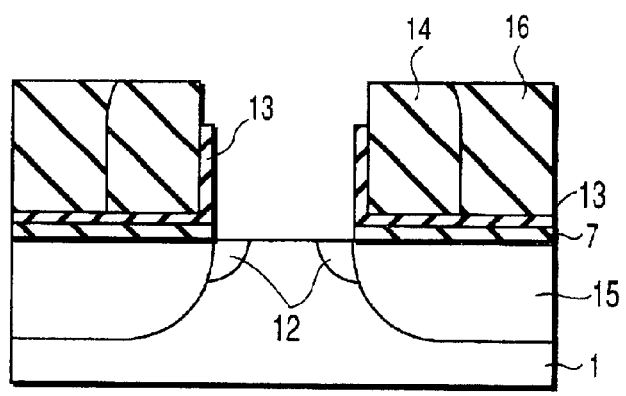
F I G. 2G

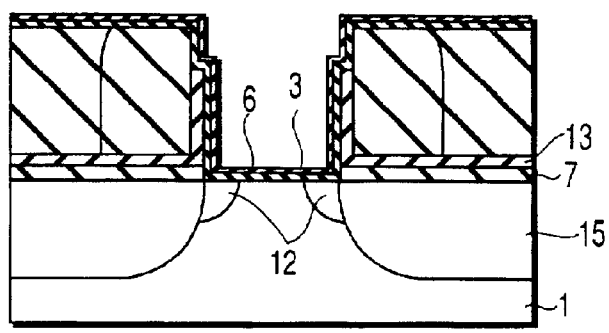
F I G. 2H
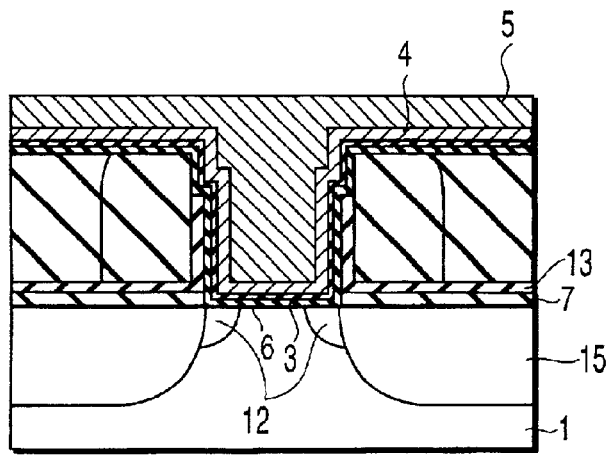
F I G. 2I
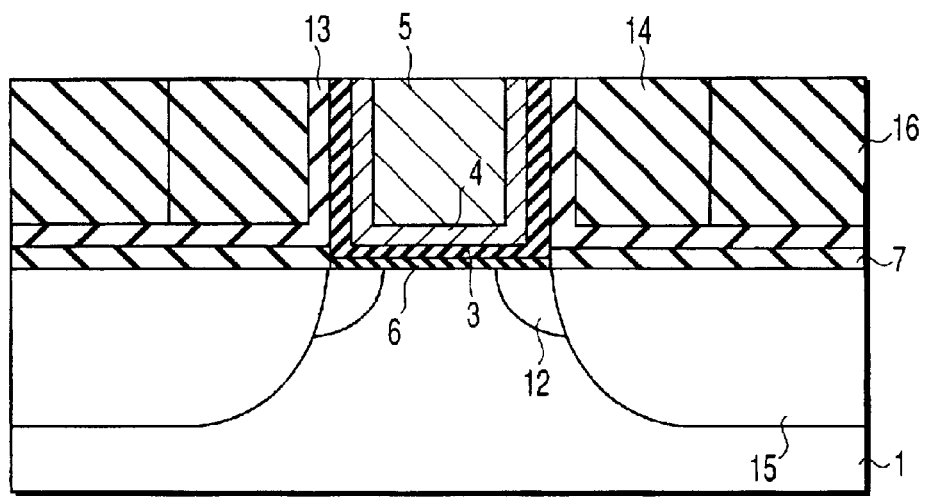
F I G. 3

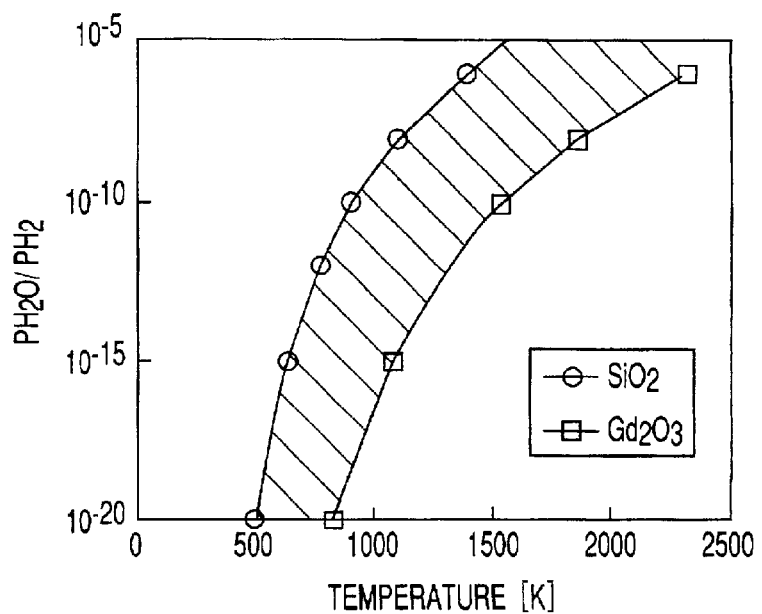
FIG. 6
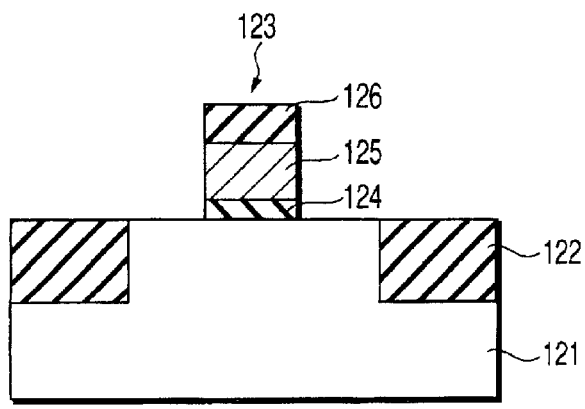
FIG. 7A
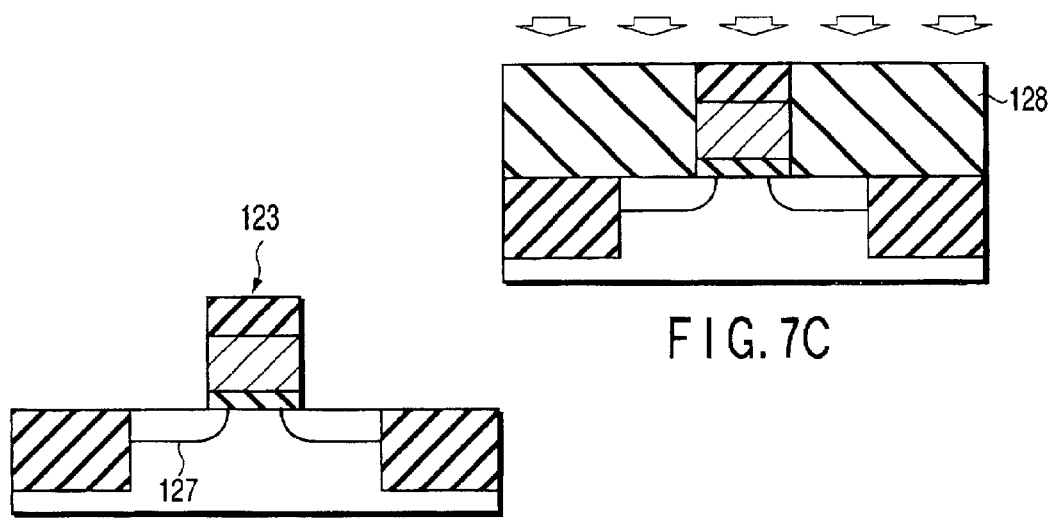
FIG. 7B
FIG. 7C

SEMICONDUCTOR DEVICE HAVING A GATE INSULATING FILM STRUCTURE INCLUDING AN INSULATING FILM CONTAINING METAL, SILICON AND OXYGEN AND MANUFACTURING METHOD THEREOF

RELATED APPLICATION

This application claims priority to Japanese Application No. 2000-066960 filed Mar. 10, 2000, incorporated herein by reference.

BACKGROUND OF THE INVENTION

1. Field of the Invention

This invention is directed to a semiconductor device and a manufacturing method of the semiconductor device. More particularly to a semiconductor device having a gate insulating film structure including an insulating film which contains metal, silicon and oxygen, for example, a metal silicate film and the manufacturing method thereof.

2. Description of the Related Art

It is desirable to make a thin gate insulating film for the miniaturization of the Metal Insulator Semiconductor Field Effect Transistor ("MISFET"). If a thin silicon oxide film or silicon oxide-nitride film is used as the gate insulating film, a leak current, that is, a direct tunnel current is increased due to a reduction in the film thickness. As a result, the minimum thickness is approximately 2 nm.

Therefore, it is proposed to suppress a leak current by using a metal oxide film or metal silicon-oxide film (hereinafter referred to as a metal silicate film) having a dielectric constant larger than that of the silicon oxide film. That is, when a metal silicate film or a metal oxide film is used as a gate insulating film, the film thickness for attaining an electrical characteristic equivalent to that of a silicon oxide film ("effective film thickness") can be reduced.

However, when the metal oxide film is used as the gate insulating film, it is difficult to obtain a good interface which is free from distortion in a portion facing a silicon substrate. Additionally, when the metal silicate film is used as the gate insulating film, a mediocre interface is attained, with a smaller dielectric constant than that of the metal oxide film.

It was postured to form a metal silicate film at the interface between a silicon substrate and a metal oxide film by heat treatment after formation of the metal oxide film on the silicon substrate so as to form a laminated structure of the two films on the silicon substrate. Unfortunately, with time, the constituent metals of the two films become the same. Therefore, it is difficult to attain the best combination of the metal oxide film and metal silicate film by using different kinds of the constituent metals of the two films. Additionally, since metal oxide film is made of a crystalline metal oxide material, the effective film thickness locally varies due to its dependency on the dielectric constant of the crystal plane orientation.

The metal oxide film and metal silicate film are formed by a Chemical Vapor Deposition ("CVD") method, but a metal oxide film formed by the CVD method has a composition slightly different from a stoichiometric composition and tends to become a coarse film with a low density.

When two MISFETs with different gate insulating film thickness are formed on the same semiconductor substrate, the process of forming a metal oxide film on the entire surface of the substrate, removing part of the metal oxide film on the gate region of one of the MISFETs whose gate insulating film is made thin and forming a metal oxide film on the entire surface of the resultant structure are required. Unfortunately, this process is complicated and inefficient.

Thus, using a metal oxide film or metal silicate film as an insulating film a dielectric constant larger than that of a silicon oxide film is proposed. However, there are many problems in maintaining the characteristics of the gate insulating film while attaining the reduction in the physical and/or the actual film thickness. Specifically, problems with respect to the characteristic of the resulting elements and the productivity of manufacturing the elements.

OBJECT OF THE INVENTION

Accordingly, the object of the present invention is to solve these problems by providing a semiconductor device having a metal oxide film or an insulating film containing metal, silicon and oxygen. Specifically, the present invention provides a metal silicate film as a gate insulating film where the characteristics of the elements in a semiconductor device and the productivity of manufacturing miniature semiconductor device are enhanced and its manufacturing method thereof.

SUMMARY OF THE INVENTION

A semiconductor device according to present invention has a gate insulating film including an insulating film with metal, silicon and oxygen, for example, a metal silicate film having at least one of fluorine and nitrogen.

According to the object of the present invention, the dangling bond on the interface between the metal silicate film and silicon that made up the semiconductor substrate can be brought to an end by fluorine contained in the metal silicate film. Therefore, the interface state density can be lowered as compared to a metal silicate film without fluorine and a good interface characteristic is attained.

Further, the dielectric constant of the metal silicate film is increased and the effective film thickness reduced when it contains nitrogen. The annealing process for the metal oxide film is carried out under an oxidizing atmosphere (to compensate for oxygen deficiency) to avert the oxidizing reaction in the interface between the metal silicate film and silicon which made up the semiconductor substrate. Thus, the effective film thickness is reduced and good interfacial characteristic such as a low interface state density is attained.

Thus, a high performance transistor is produced by positioning a metal-containing metal silicate insulating film, having silicon, oxygen, and at least one fluorine and one nitrogen between the semiconductor substrate and the metal oxide film. The transistor thus produced has a good interfacial characteristic with a film gate insulating film containing metal silicate film that has a reduced effective film thickness and a reduced leak current.

A semiconductor device according to another aspect of the present invention has a gate insulating film constructed by laminating a metal silicate insulating film having metal, silicon, and oxygen together with an amorphous metal oxide film. The gate insulating film having the metal oxide film and metal silicate film thus produced has a reduced effective film thickness and a reduced leak current. Further, since the metal oxide film is an amorphous film, a transistor thus produced has a reduced variation of the effective film thickness which depends on the dielectric constant of the crystal plan orientation and a less variation in the threshold voltage with excellent reliability.

Moreover, the metal oxide film in accordance with the present invention is formed after formation of the insulating film with metal, silicon, and oxygen. This is contrary to the industrial practice of forming the metal, silicon and oxygen containing insulating film by heat treatment after the metal oxide film is formed. The metal constituent of the metal oxide film can be replaced from the main metal constituent of the insulating film containing metal, silicon, and oxygen. Further, the insulating film containing metal, silicon, and oxygen and the amorphous film of the metal oxide film can be obtained by changing the heat treatment to a lower temperature than the crystallization temperature of the insulating film containing metal, silicon, and oxygen and higher than the crystallization temperature of the metal oxide film after the formation of the insulating film containing metal, silicon, and oxygen and before the formation of the metal oxide film.

Further, the present invention is a manufacturing method of a semiconductor device having a metal oxide film as one of a multi-layered gate insulating film. The invention is characterized by effecting the heat treatment in an atmosphere containing a plurality of gases with different oxidizing powers after the formation of the metal oxide film on the semiconductor substrate. In other words, the different oxidizing powers can be explained as different tendency for an oxidation-reduction.

Conditions for heat treatment are set to only oxidize the metal contained in the metal oxide film without oxidizing silicon in the boundary region between the semiconductor substrate and the metal oxide film.

In this invention, the insulating film containing metal, silicon, and oxygen is termed "metal silicon-oxygen film" (metal silicate film). However, the metal silicon-oxygen film can be used when metal oxide and silicon oxide are separated, as a mixture and when metal, silicon, and oxygen uniformly exist as a compound. Any of these uses described for metal silicate film are suitable in the present invention.

In this disclosure, "comprising", "comprises" and the like can have the meaning ascribed to them in U.S. Patent Law and can mean "includes", "including" and the like.

These and other embodiments will be described and/or will be obvious from the following detailed description.

BRIEF DESCRIPTION OF THE DRAWINGS

FIG. 1A shows a cross sectional view of a semiconductor device according to a first embodiment of the present invention;

FIG. 1B shows a cross sectional view of a semiconductor device according to a modification of the first embodiment of this invention;

FIGS. 2A to 2I show cross sectional views of each of the main portions in each respective step of a manufacturing method of the semiconductor device according to the first embodiment of this invention;

FIG. 3 shows a cross sectional view of a semiconductor device according to a second embodiment or a third embodiment of this invention;

FIG. 6 is an hydrogen-water vapor partial pressure equilibrium curve for oxidation of silicon ("$SiO_2$") and gadolinium ("$Gd_2O_3$") for selective oxidation in the manufacturing process of the fourth embodiment of this invention;

FIGS. 7A to 7F show cross sectional views of each of the main portions in each respective step of a manufacturing method of a semiconductor device according to a fifth embodiment of this invention;

Figure 2A:
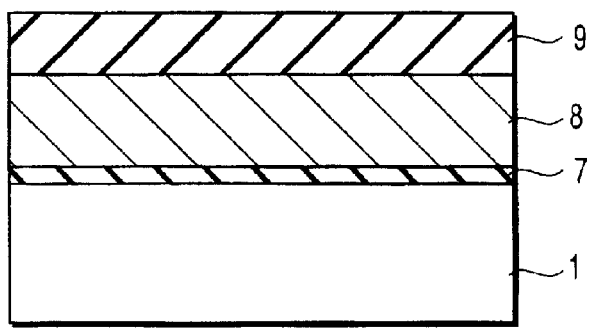

DETAILED DESCRIPTION OF THE INVENTION (Embodiment 1)

Without wishing to unnecessarily limit the foregoing, the following shall discuss the invention with respect to certain preferred embodiments.

A first embodiment of this invention will now be described with reference to FIGS. 1A to 1B and 2A to 2I of the accompanying drawings.

FIG. 1A shows a structure of a semiconductor device according to the first embodiment of this invention.

A metal silicon-oxygen material film (hereinafter a "metal silicate film") 6 (which is a zirconium silicate film in accordance with this embodiment) as a compound of metal, silicon and oxygen, and a metal oxide film 3 (which is a zirconium oxide film in accordance with this embodiment) are formed as a gate insulating film on a silicon substrate 1. A titanium nitride film 4 is formed on metal oxide film 3 and a tungsten film 5 is formed on titanium nitride film 4 so as to fill a cavity formed on titanium nitride film 4 so that a multi-layered gate electrode is formed on metal oxide film 3.

The film thickness of zirconium silicate film 6 is approximately 1.5 nm, the film thickness of zirconium oxide film 3 is approximately 3 nm, and the film thickness obtained when the film thickness of each of the above films 6 and 3 is expressed in terms of the film thickness of a silicon oxide film and that thickness is approximately 0.5 nm and the effective gate insulating film thickness is approximately 1 nm. Zirconium silicate film 6 disposed between the gate electrode and silicon substrate 1 contains a small amount of fluorine. The width of the gate electrode is approximately 50 nm.

The number of atoms for each unit volume is preferably set at about from $1 \times 10^{19}$ cm$^{-3}$ to about $1 \times 10^{21}$ cm$^{-3}$ as the amount of fluorine contained in zirconium silicate film 6. The number of atoms are preferably at a peak concentration of approximately from $5 \times 10^{19}$ cm$^{-3}$ to $5 \times 10^{20}$ cm$^{-3}$ and in a position of zirconium silicate film 6 near the interface of silicon substrate 1.

An effective amount of fluorine can be correct a distortion at the junction portion between zirconium silicate film 6 and silicon substrate 1 so as to improve the bond mismatching between zirconium silicate film 6 and silicon substrate 1. In addition to Zirconium ("Zr") silicate film, the metal in the metal silicate film 6 can be, but is not limited to, hafnium (Hf) silicate film, lanthanum (La) silicate film, gadolinium (Gd) silicate film, yttrium (Y) silicate film, aluminum (Al) silicate film and titanium (Ti) silicate film. Further, it is possible to use a metal silicate film containing two or more of the above metal elements (Zr, Hf, La, Gd, Y, Al, Ti).

In addition to the Zirconium oxide film, the metal in metal oxide film 3 can be, but is not limited to, tantalum oxide film, titanium oxide film, lanthanum oxide film, hafnium oxide film, gadolinium oxide film, yttrium oxide film and aluminum oxide film. Further, it is possible to use a metal oxide film containing two or more of the above metal elements (Zr, Ta, ti, La, Hf, Gd, Y, Al).

A manufacturing method of a semiconductor device according to the first embodiment, which includes a gate electrode manufacturing process by a damascene gate process, will now be explained with references to FIGS. 2A to 2I.

A damascene gate process is a process in which a dummy gate is first formed. This dummy gate is later replaced by a gate electrode on a gate forming region of the surface of the semiconductor substrate in which source and drain regions are formed. The dummy gate is subsequently wholly surrounded by an insulating film and both the dummy gate and the insulating film are treated by a Chemical Mechanical Polishing ("CMP") method so that the dummy gate and the insulating share a common flat surface. The dummy gate exposed in the insulating film is removed to form a groove in the form of a target gate electrode in the insulating film, and a gate electrode material is filled into the groove after a gate insulating film is formed at the bottom surface of the groove. Finally, the gate electrode material filled in the groove is treated by the CMP method to form the target gate electrode. This damascene process is further explained below.

First, as shown in FIG. 2A, a silicon oxide film 7 with a film thickness of about 3 nm is formed by a thermal oxidation method on the surface of a silicon substrate 1 on which element isolation regions (not shown) is formed by a Shallow Trench Isolation ("STI") technique. A polysilicon film 8 with a film thickness of approximately 50 nm and a silicon nitride film 9 with a film thickness of approximately 30 nm are deposited by a Low Pressure Chemical Vapor Deposition ("LPCVD") method.

Figure 2C:
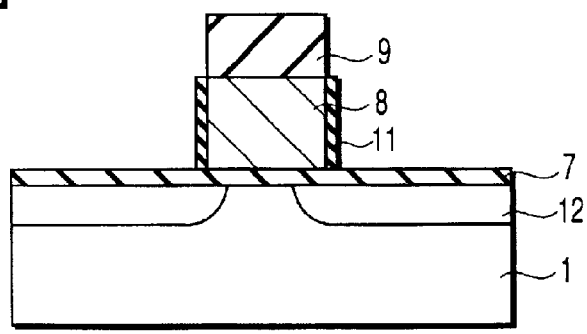
Figure 2B:
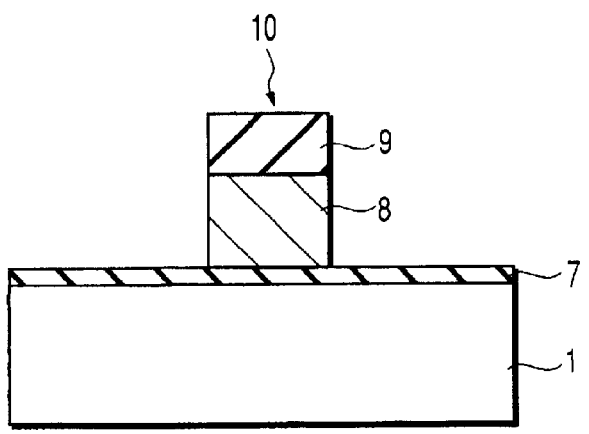

As shown in FIG. 2B, silicon nitride film 9 and polysilicon film 8 are selectively removed by lithography technique and Reactive Ion Etching ("RIE") method, so that a dummy gate pattern 10 is formed on a region of substrate 1 on which a gate electrode is to be formed.

As shown in FIG. 2C, a silicon oxide film 11 is formed on side walls of polysilicon film 8 by thermal oxidation at approximately 1000° C. Then, arsenic ("As") ion implantation is effected in an acceleration voltage of approximately 15 keV and does amount of about $5 \times 10^{14}$ cm$^{-2}$, for example, to form source and drain extension regions 12 in self-alignment with dummy gate pattern 10.

Figure 2D:
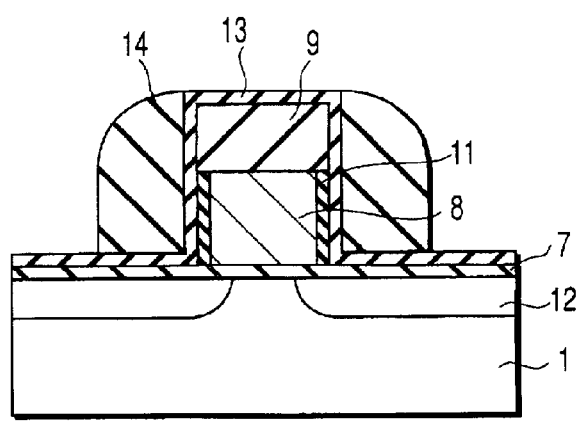

As can be seen in FIG. 2D, after a Rapid Thermal Anneal ("RTA") process is effected at about 800° C. for about ten seconds, a silicon nitride film 13 with a film thickness of about 10 nm and a silicon oxide film 14 with a film thickness of about 50 nm are deposited on the entire surface by the LPCVD method. Then, by effecting the etch-back process, side walls of silicon oxide film 14 with the form shown in FIG. 2D are formed.

As can be seen in FIG. 2E, arsenic ("As") ion implantation is effected in an acceleration voltage of approximately 35 keV, dose amount of about $5 \times 10^{15}$ cm$^{-2}$, and an RTA process at approximately 1035° C. for about ten seconds to form source and drain diffusion regions 15 superimposed on extension regions 12.

In FIG. 2F, a silicon oxide film 16 with a film thickness of approximately 100 nm is deposited on the entire surface and is then flattened by using a CMP method to expose the upper portion of dummy gate pattern 10.

Subsequently, silicon nitride film 9 of dummy gate pattern 10 in FIG. 2G is removed by using hot phosphoric acid. Polysilicon film 8 is then removed by dry etching. Further, the channel ion implantation process and activation annealing process are effected to adjust the threshold voltage of a transistor being formed with respect to dummy gate pattern 10. Then, the part of silicon oxide film 7 exposed at the bottom of the walls of silicon nitride film 13 is removed by using a diluted hydrofluoric acid solution to expose the corresponding part of the surface of silicon substrate 1 which will be used as a channel region.

Next, in FIG. 2H, a zirconium silicate film 6 with a film thickness of approximately 1.5 nm is formed by LPCVD using zirconium chloride (ZrCl$_4$), tetraethoxysilane (TEOS, Si(OC$_2$H$_5$)$_4$) and O$_2$, N$_2$O, NO, or H$_2$O, which is an oxidant. After the resultant structure is subjected to the annealing process at approximately 800° C. for about 30 seconds, a zirconium oxide film 3 with a film thickness of approximately 3 nm is deposited on the resultant structure by LPCVD using zirconium chloride (ZrCl$_4$) and O$_2$, N$_2$O, NO, or H$_2$O, which is an oxidant.

As finally shown in FIG. 2I, a titanium nitride film 4 with a film thickness of approximately 10 nm and a tungsten film 5 with a film thickness of approximately 100 nm are deposited on the entire surface. Fluorine is ion-implanted at an acceleration voltage of approximately 30 keV and a dose amount of approximately $1 \times 10^{15}$ cm$^{-2}$ to dope fluorine into tungsten film 5.

The resultant structure is finally subjected to planarization by CMP in a non-oxidizing atmosphere (for example, nitrogen or argon atmosphere), the annealing process is effected at a temperature of approximately 500° C. to 650° C. By this annealing process, fluorine that was doped into tungsten film 5 is diffused and segregated into zirconium silicate film 6 which was subsequently formed on the interface with silicon substrate 1.

Finally, the structure depicted in FIG. 1A is formed. Subsequently, procedures such as wiring process are executed to complete the production of a transistor.

The thickness of the metal oxide film and the metal silicate film on the interface region obtained in accordance with the teaching of the first embodiment of the present invention when converted into the film thickness of the silicon oxide film, can be made equal to or less than about 1 nm. Specifically, in order to obtain this desired film thickness, the metal silicate film formed has a dielectric constant larger than that of the silicon oxide film and silicon oxide-nitride film (SiON film) and was then deposited on the interface region between the metal oxide film (which is the film with a large dielectric constant) and a part of the silicon substrate acting as a channel region.

Further, the dangling bond on the interface of the silicon substrate can be terminated by doping fluorine into the metal silicate film in order to obtain a good interfacial characteristic. Therefore, an unstable bonding factor between molecules on the interface is reduced. In addition, the interface state density can also be lowered to a level less than that of the normal metal silicate film not doped in fluorine.

Therefore, a high-performance transistor is provided in which the effective film thickness of the gate insulating film formed from the metal oxide film and metal silicate film can be made extremely small with a reduced leak current that is devoid of short channel effect.

In accordance with this embodiment, further explanation is provided for the damascene gate process having a low temperature heating step after the formation of gate insulating films 6 and 3 and metal gate electrodes 4 and 5 are formed, but if a normal transistor forming process in which a polysilicon film is used as the gate electrode instead of the metal gage electrode is used, the same effect can be attained.

Further, in this embodiment, a laminated structure of metal oxide film 3 and metal silicate film 6 is used as the gate insulating film, but as a modification shown in FIG. 1B, it is possible to use a single-layered film of metal silicate film 6.

Further, nitrogen can be contained in metal silicate film 6 instead of doping fluorine. Further, both fluorine and nitrogen can be contained in metal silicate film 6. Since the other portions are the same as those shown in FIG. 1A, they are denoted by the same reference numerals and detailed explanation thereof is omitted here. The effect of nitrogen doping will be explained in embodiment 2.

When nitrogen is contained in metal silicate film 6, it is preferable to set the amount of nitrogen contained in metal silicate film 6 to about from $1 \times 10^{14}$ cm$^{-2}$ to about $1 \times 10^{15}$ cm$^{-2}$ when the total number of atoms is expressed in terms of surface density. Particularly, it is desirable to set the number of atoms so as to have the concentration peak in a position near the interface with silicon substrate 1.

(Embodiment 2)

FIG. 3 is a cross sectional view of a semiconductor device according to a second embodiment of this invention. The basic structure is similar to that of the embodiment 1 shown in FIG. 1A and portions of FIG. 3 which corresponds to those of FIG. 1A are denoted by the same reference numerals.

In the embodiment shown in FIG. 3, a zirconium silicate film 6 is formed only on the surface of a substrate 1, the film thickness thereof is approximately 1.5 nm, the film thickness of a zirconium oxide film 3 is approximately 3 nm, the film thickness obtained by converting the film thickness of each of these films into the film thickness of a silicon oxide film is approximately 0.5 nm and the total effective gate insulating film thickness is approximately 1 nm. In this embodiment, a small amount of nitrogen instead of fluorine is contained in zirconium silicate film 6 between the gate electrode and silicon substrate 1. The width of the gate electrode is approximately 50 nm.

It is preferable to set the amount of nitrogen contained in zirconium silicate film 6 to about from $1 \times 10^{14}$ cm$^{-2}$ to about $1 \times 10^{15}$ cm$^{-2}$ when the total number of atoms is expressed in terms of the surface density. Particularly, it is desirable to set the number of atoms so as to have the concentration peak in a position near the interface with silicon substrate 1.

Similar to embodiment 1, it is possible to use various types of metal silicate films and metal oxide films instead of zirconium silicate film 6 and zirconium oxide film 3.

Next, a manufacturing method of a semiconductor device according to embodiment 2, as described, above will now be explained in detail with reference to FIGS. 4A to 4D. Since the manufacturing method of embodiment 2 is the same as that of embodiment 1 up to the step of FIG. 2G, only the subsequent processes are explained here.

Figure 4A:
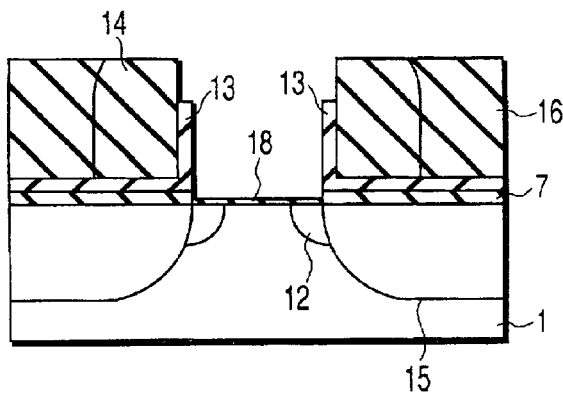
FIGS. 4A to 4D show cross sectional views of each of the main portions in each respective step of a manufacturing method of the semiconductor devices according to the second or this embodiment shown in FIG. 3.

After the step shown in FIG. 2G, as can be seen FIG. 4A, a silicon oxide-nitride film (SiON) 18 with a film thickness of approximately 0.7 nm is formed only on the exposed surface of silicon substrate 1.

Figure 4B:
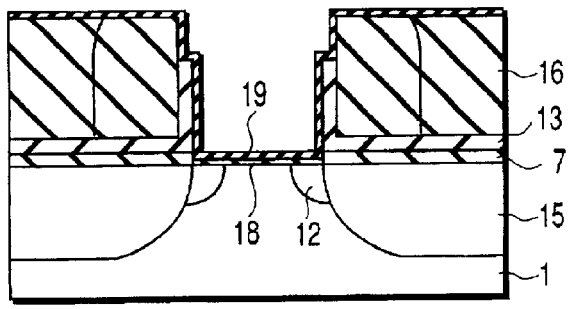

Next, as shown in FIG. 4B, a zirconium oxide film 19 with a film thickness of approximately 1 nm is deposited on the entire surface by LPCVD using zirconium chloride (ZrCl$_4$) and O$_2$ or H$_2$O.

Figure 4C:
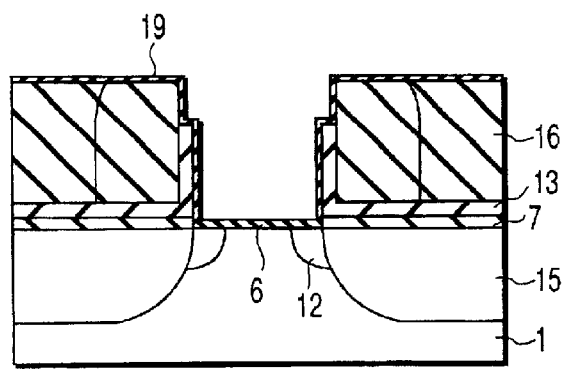

Then, as shown in FIG. 4C, a zirconium silicate film 6 with a film thickness of approximately 1.5 nm containing nitrogen is formed only on the bottom surface of a groove in which a gate electrode is to be formed by effecting the annealing process at about 800° C. for about 30 seconds to react silicon oxide-nitride (SiON) film 18 with zirconium oxide film 19.

Figure 4D:
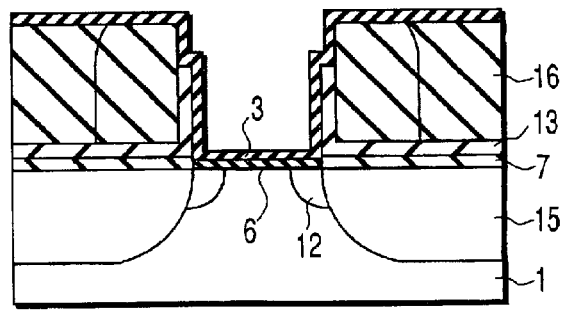

After this, as evident in FIG. 4D, a zirconium oxide film 3 with a film thickness of approximately 3 nm is deposited on the resultant structure by LPCVD using zirconium chloride (ZrCl$_4$) and O$_2$, N$_2$O, NO, or H$_2$O, which is an oxidant. Thus, oxygen deficiency in zirconium oxide film 3 which occurs immediately after formation of the film is compensated by effecting the annealing process in an ozone atmosphere at a temperature of about 400° C. for approximately three minutes.

Next, a titanium nitride film 4 which a film thickness of approximately 10 nm and a tungsten film 5 with a film thickness of approximately 100 nm are deposited on the entire surface and then the resultant structure is subjected to planarization by CMP and thus, the structure shown in FIG. 3 is formed. After this, normal procedures including wiring process or the like are successively effected in order to complete a transistor.

Also, in embodiment 2, similar to embodiment 1, by forming metal silicate film 6 on the interface region between metal oxide film 3 and silicon substrate 1, the film thickness of the film on the interface region obtained when converted into the film thickness of a silicon oxide film, can be made equal to or less than 1 nm.

Further, since the dielectric constant of metal silicate film 6 can be increased by doping nitrogen into metal silicate film 6, the physical film thickness of the gate insulating film can be made smaller and the performance of the transistor can be enhanced. In addition, the oxidizing reaction on metal silicate film 6/silicon substrate 1 interface by the oxidant can be suppressed in the annealing process under the oxidizing atmosphere in order to compensate for the oxygen deficiency in metal oxide film 3 by doping nitrogen into metal silicate film 6. As a result, the effective film thickness of the gate insulating film can be made smaller, an increase in the interface level in the low-temperature oxidation step can be suppressed to a low level and a good interfacial characteristic can be attained.

Therefore, a high-performance transistor can be provided in which the effective film thickness of the gate insulating film formed on metal oxide film 3 and metal silicate film 6 can be made extremely small, a leak current is reduced and the short channel effect can be suppressed.

In this embodiment, a laminated structure of metal oxide film 3 and metal silicate film 6 is used as the gate insulating film, but like the modification shown in FIG. 1B, it is possible to use a single-layered film of the metal silicate film and cause the metal silicate film to contain nitrogen. Further, a transistor forming process can be used instead of the described damascene gate process.

Also, it is possible for metal silicate film to contain a proper amount of fluorine and nitrogen as in the first embodiment.

Further, in embodiment 2, zirconium oxide film 3 and zirconium silicate film 6 are formed by the use of the same metal of zirconium when the laminated structure of metal oxide film 3 and metal silicate film 6 is formed as the gate insulating film. However, it is possible to use different metals for forming films 3 and 6, for example to form a tantalum oxide film and zirconium silicate film, for example.

Thus, in this invention, since the metal oxide film is deposited after the metal silicate film is deposited, instead of forming the metal silicate film on the interface between the silicon substrate and the metal oxide film by heat treatment after the metal oxide film is formed, the main constituent metal of the metal oxide film and the main constituent metal of the metal silicate film can be made different from each other. Therefore, a good interfacial characteristic can be attained by the use of a stable metal silicate film and a metal oxide film having a large dielectric constant formed on the metal silicate film.

As will be explained in detail later, both metal oxide and metal silicate films can be formed into an amorphous form by effecting heat treatment at a temperature lower than the crystallization temperature of the metal silicate film and higher than the crystallization temperature of the metal oxide film after depositing the metal silicate film and then depositing the metal oxide film. Therefore, it is possible to attain a transistor with a local variation in the reduction of effective film thickness that is caused by the dependency of the dielectric constant on the crystal plane orientation and which has less variation in the threshold voltage and is excellent in reliability. In a case where the laminated structure of the metal oxide film and metal silicate film is used as the gate insulating film, it is sufficient, if at least one of the above films is formed in an amorphous form, or both of the films are amorphous as described above. When only one of the metal oxide film and the metal silicate film is formed into the amorphous form, it is possible to set the temperature for the thermal treatment thereof at a value higher or lower than the crystallization temperature.

Further, in a case where the laminated structure of the metal oxide film and metal silicate film is formed by using different metals, at least one fluorine and one nitrogen can be introduced into the metal silicate film, as taught in the first embodiment. Additionally, normal transistor forming processes can be used instead of the damascene gate process. In this case, however, the metal oxide film may be crystallized in some cases.

Further, a single film structure of the metal silicate film may be used instead of using a gate insulating film of the laminated structure of the metal silicate film and the metal oxide film. Further, as in the first embodiment, it is possible to contain fluorine instead of nitrogen in the metal silicate film or to contain both fluorine and nitrogen in the metal silicate film.

When the metal silicate film contains fluorine, it is preferable to set the number of atoms for each unit volume at about from $1 \times 10^{19}$ cm$^{-3}$ to about $1 \times 10^{21}$ cm$^{-3}$ as the amount of fluorine contained in metal silicate film 6. Particularly, it is desirable to set the number of atoms having the concentration peak from about $5 \times 10^{19}$ cm$^{-3}$ to about $5 \times 10^{20}$ cm$^{-3}$ in a position of metal silicate film 6 near the interface with silicon substrate 1. The advantages of doping fluorine into the metal silicate film have been explained in the description of the first embodiment.

(Embodiment 3)

The structure and manufacturing process of a semiconductor device according to an embodiment 3 of this invention will now be explained. The basic structure is similar to that of embodiment 2 shown in FIG. 3, except that the constituent material of the gate insulating film is amorphous. Embodiment 3 will now be explained with reference to FIG. 3.

Like embodiment 2, embodiment 3 uses zirconium oxide film as a metal oxide film 3 and a zirconium silicate film as a metal silicate film 6. The film thickness of zirconium silicate film 6 is approximately 1.5 nm, the film thickness of zirconium oxide film 3 is approximately 3 nm, the film thickness obtained by converting the film thickness of each of the above films 3 and 6 into the film thickness of a silicon oxide film is approximately 0.5 nm and the effective gate insulating film thickness is approximately 1 nm. The width of the gate electrode is approximately 50 nm.

Similar to embodiment 2, it is possible to use various types of metal silicate films and metal oxide films instead of zirconium silicate film 6 and zirconium oxide film 3.

Next, a manufacturing method of the semiconductor device according to the embodiment 3 is explained. Since the manufacturing method is the same as that of embodiment 2 up to the gate insulating film forming step and only differs in that the gate insulating film material si crystalline or amorphous, the succeeding process is explained by using the same drawings (FIGS. 4A to 4D).

After the step shown in FIG. 2G, as shown in FIG. 4A, an amorphous silicon oxide-nitride film 18 with a film thickness of approximately 0.7 nm is formed on the exposed surface of silicon substrate 1.

Next, as shown in FIG. 4B, a zirconium oxide film 19 with a film thickness of approximately 1 nm is deposited by LPCVD using tetra-tertiary butoxyzirconium $(Zr(t-OC_4H_9)_4)$ and $O_2$ or $H_2O$.

Then, as shown in FIG. 4C, an amorphous zirconium silicate film 6 with a film thickness of approximately 1.5 nm is formed only on the bottom surface of a groove by effecting the annealing process at about 800° C. for about 30 seconds.

After this, as shown in FIG. 4D, an amorphous zirconium oxide film 3 with a film thickness of approximately 3 nm is deposited by LPCVD using tetratertiary butoxyzirconium ($Zr(t-OC_4H_9)_4$) and $O_2$ or $H_2O$.

Next, a titanium nitride film 4 with a film thickness of approximately 10 nm and a tungsten film 5 with a film thickness of about 100 nm are deposited on the entire surface and then the resultant structure is subjected to planarization by CMP. Thus, the structure shown in FIG. 3 is formed. After this, regular procedures including wiring process or the like are effected to complete the making of a transistor. Since the wiring process is normally effected at a temperature lower than about 500° C., zirconium oxide film 3 can be kept in an amorphous state.

Thus, in embodiment 3, as is in embodiment 2, by forming the metal silicate film on the interface region between the metal oxide film and the silicon substrate, the thickness of the film on the interface region when converted into the film thickness of a silicon oxide film, can be made equal to or less than about 1 nm and a good interfacial characteristic can be attained.

Therefore, a high-performance transistor is provided in which the effective film thickness of the gate insulating film formed from the metal oxide film and metal silicate film can be made extremely small, a leak current reduced, and short channel effect averted.

Further, since both metal oxide film and metal silicate film can be formed in an amorphous form, it is possible to attain a transistor in which a local variation in the effective film thickness caused by the dependency of the dielectric constant on the crystal plane orientation can be reduced and which has a less variation in the threshold voltage and is excellent in the reliability.

In embodiment 3, as in the first and second embodiments, it is possible to introduce one or both fluorine and/or nitrogen into the metal silicate film. The amount of fluorine and/or nitrogen can be set in a manner similar to those in the first and second embodiments. Further, a transistor forming process can be used instead of the damascene gate process. In this case, however, the metal oxide film may be crystallized in some instances.

(Embodiment 4)

Embodiment 4 of the present invention will now be explained with reference to FIGS. 5A to 5H and 6.

FIGS. 5A to 5H are cross sectional views of the respective steps of a manufacturing method of a semiconductor device according to embodiment 4 of the present invention.

Figure 5A:
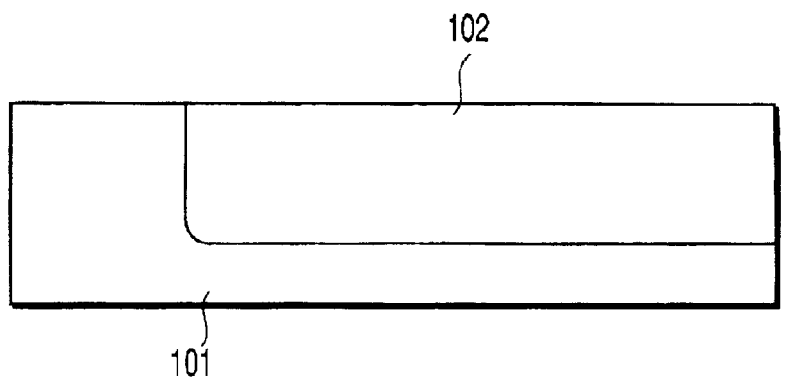
FIGS. 5A to 5H show cross sectional views of each of the main portions in each respective step of a manufacturing method of a semiconductor device according to a fourth embodiment of this invention.

First, as shown in FIG. 5A, arsenic ("As") is implanted ionically into a silicon substrate 101 and the thermally diffused to form an N-type region 102 with a depth of approximately 1 $\mu$m.

Figure 5B:
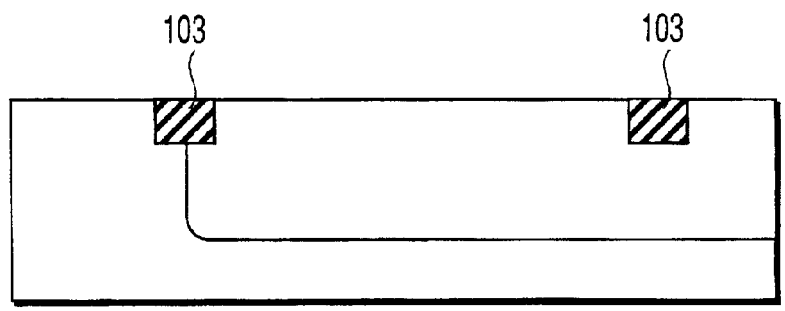

As shown in FIG. 5B, a silicon oxide film with a film thickness of approximately 600 nm is buried in a preset region to form an element isolation region 103 of a Shallow Trench Isolation ("SIT") structure.

Figure 5C:
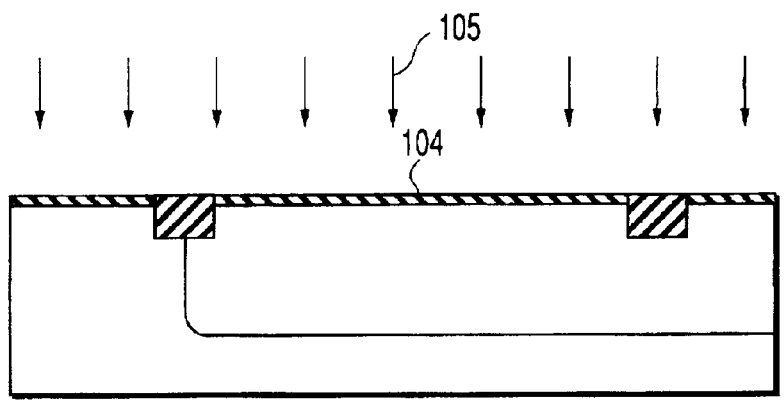

Next, as shown in FIG. 5C, a protection oxide film 104 with a film thickness of approximately 10 nm is formed. After this, an impurity ion 105 for adjusting the threshold voltage of a transistor is doped.

Figure 5D:
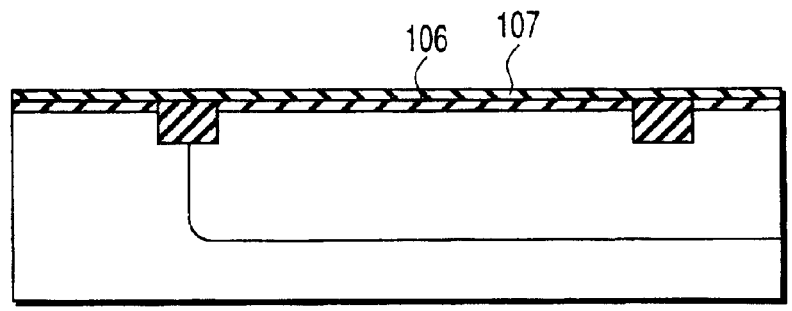

After the removal of protection oxide film 104, as shown in FIG. 5D, a silicon oxide-nitride film (SiON film) 106 with a film thickness of approximately 1 nm is formed. Next, a metal oxide film (which is a film with large dielectric constant) 107 formed of gadolinium oxide ($GdO_X$) with a film thickness of approximately several nm is formed by CVD or the like. The metal oxide film formed by CVD or the like is a coarse film that is generally different from a stoichiometric composition. Therefore, in order to make metal oxide film 107 closer to the stoichiometric composition, an oxidation process (heat treatment) is applied. The oxidation process is applied so as to selectively oxidize only oxide film 107 without oxidizing the silicon on the surface of silicon substrate 101. For this purpose, the heat treatment is applied in an atmosphere containing two kinds of gases having different oxidizing strengths. Specifically, the heat treatment is applied under an atmosphere containing water vapor ($H_2O$) which is an oxidant and hydrogen ($H_2$) which is a reductant.

FIG. 6 shows an equilibrium hydrogen-water vapor partial pressure curve for oxidation of silicon (Si) and gadolinium (Gd). Since the standard free energies of a silicon oxide film and a metal oxide film are different from each other, an atmosphere which exhibits an oxidizing property for the metal oxide film and a reducing property for the silicon oxide film can be formed by adequately selecting the appropriate partial pressure of hydrogen and water vapor. Only gadolinium can be oxidized without oxidizing silicon by applying heat treatment in the hatched region shown in FIG. 6 according to the thermodynamic calculation based on Gibbs free energy.

By effecting the heat treatment in the above-described condition, gadolinium oxide ($GdO_X$) alone can be made closer to the stoichiometric composition without forming a silicon oxide film on the interface region and a dense metal oxide film 107 can be obtained. Therefore, it is possible to provide a gate insulating film which has less of a leak current and excellent characteristics without increasing the physical film thickness of the gate insulating film. If silicon oxide is formed on the surface of the silicon substrate, the silicon oxide can be reduced by the above-mentioned heat treatment.

Figure 5E:
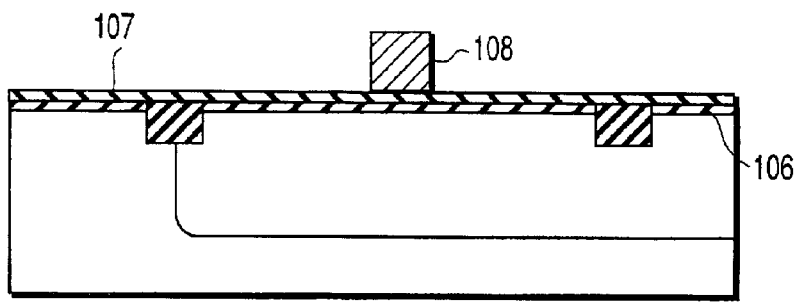

Next, as shown in FIG. 5E, a polysilicon film 108 with a film thickness of approximately 150 nm is deposited by using CVD or the like. Polysilicon film 108 is selectively etched with a photoresist as a mask to form a desired gate form.

Figure 5F:
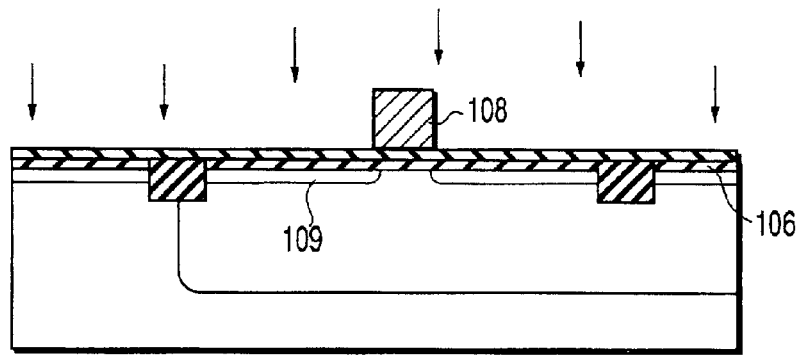

After this, as shown in FIG. 5F, boron fluoride ($BF_2$) is implanted ionically under condition of an accelerated voltage of about 10 keV and dose amount of about $5 \times 10^{14}$ cm$^{-2}$ with the gate electrode (polysilicon film 108) as a mask to form source and drain extension regions 109 (LDD regions). Extension region 109 has an effect of alleviating the pn junction electric field to suppress generation of hot electrons.

Figure 5G:
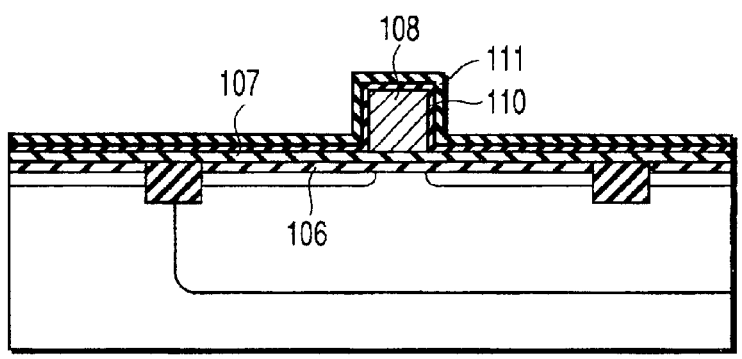

Next, as shown in FIG. 5G, a silicon oxide film ($SiO_2$ film) which is used as a liner layer 110 is deposited to a film thickness of approximately 10 nm by using LPCVD or the like. A silicon nitride film (SiN film) 111 is subsequently deposited to a film thickness of approximately 50 nm by using LPCVD or the like.

Figure 5H:
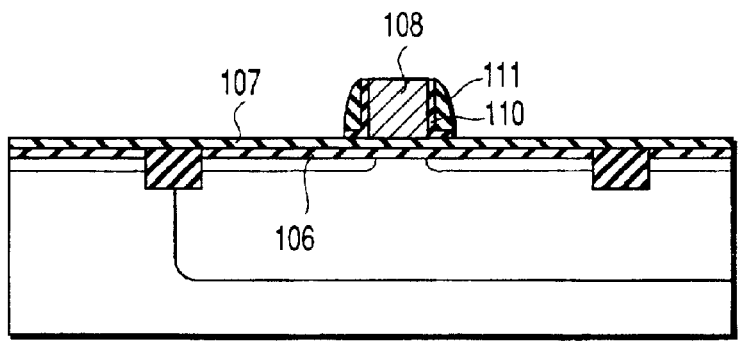

After this, as shown in FIG. 5H, silicon nitride (SiN) film 111 is selectively etched by RIE method to leave parts of silicon nitride (SiN) film 111 only on the gate side walls. Linear layer 110 plays the role of an etching stopper when RIE is applied. Then, boron (B) is implanted ionically under an accelerated voltage of approximately 5 keV and the dose amount of about $5 \times 10^{15}$ cm$^{-2}$ so as to form a high-concentration diffusion layer of the source and drain. Further, the annealing process for activation is applied at about 1000° C. for approximately ten seconds. Next, although not shown in the drawings, an interlayer insulating film, contacts, upper wirings and the like are formed.

Liner layer 110 is removed after the process step shown in FIG. 5H.

Thus, the metal oxide film of dense material can be formed and the process described above can be applied to the formation of a metal oxide film of in the embodiments 1 to 3.

(Embodiment 5)

FIGS. 7A to 7F are cross sectional views of the respective steps of a manufacturing method of a semiconductor device according to embodiment 5 of the present invention.

First, like embodiment 4, an element isolation region 122 is formed on silicon substrate 121. Then, as shown in FIG. 7A, a dummy gate 123 is formed on a region on which a gate is to be formed later. Dummy gate 123 can be formed with any structure if it can provide etching selectivity with respect to an interlayer insulating film. However, in this embodiment, dummy gate 123 is formed as follows.

First, a thermal oxide film 124 (i.e., silicon oxide film) with a film thickness of approximately several nm is formed and a polysilicon film 125 and silicon nitride film (SiN film) 126 are formed by CVD. Then, silicon nitride film (SiN) film 126 is processed into a desired form using a photoresist as a mask. After the photoresist is removed, polysilicon film 125 and thermal oxide film 124 are etched with silicon nitride film (SiN) 126 as a mask to form dummy gate 123.

Next, as shown in FIG. 7B, boron (B) is implanted ionically under an accelerated voltage of about 5 keV and dose amount of about $5 \times 10^{15}$ cm$^{-2}$ with dummy gate 123 as a mask so as to form a high-concentration diffusion layer 127 of the source and drain.

After this, as shown in FIG. 7C, an interlayer insulating film 128 is deposited by using CVD. Further, the resultant structure is flattened by CMP to expose the upper surface of dummy gate 123.

Figure 7D:
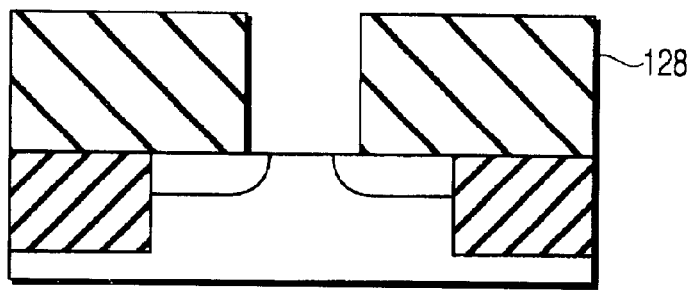

Next, as shown in FIGS. 7C and 7D, the exposed dummy gate 123 is removed by wet etching or dry etching.

Figure 7E:
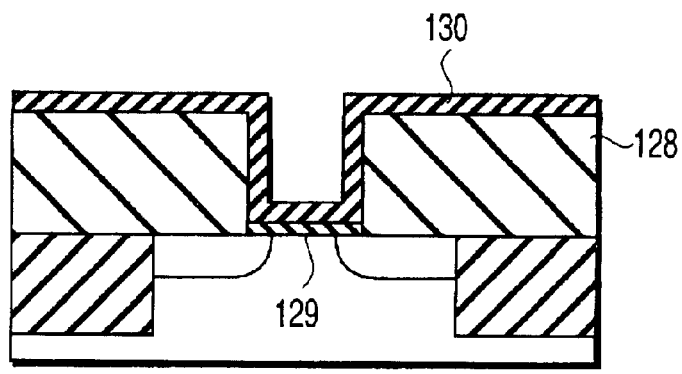

Then, after a pre-process such as an application of diluted hydrofluoric acid, a silicon oxide-nitride (SiON) film 129 with a film thickness of approximately 1 nm is formed by using of an oxidizing-nitriding process shown in FIG. 7E. Further, a metal oxide film 130 formed of gadolinium oxide (GdO$_X$) with a film thickness of approximately several nm is formed by using CVD or the like. Then, like embodiment 4, heat treatment is effected in an atmosphere containing two kinds of gases having different oxidizing powers, specifically, an atmosphere containing water vapor and hydrogen. Thus, like embodiment 4, only metal oxide film 130 is selectively oxidized without silicon being oxidized on the surface of silicon substrate 121. As a result, gadolinium oxide (GdO$_X$) alone can be made closer to the stoichiometric composition and the dense metal oxide film 130 can be formed without forming a silicon oxide film on its interface region. Therefore, a gate insulating film with a less leak current and excellent characteristics can be obtained attained without increasing the physical film thickness of the gate insulating film.

Figure 7F:
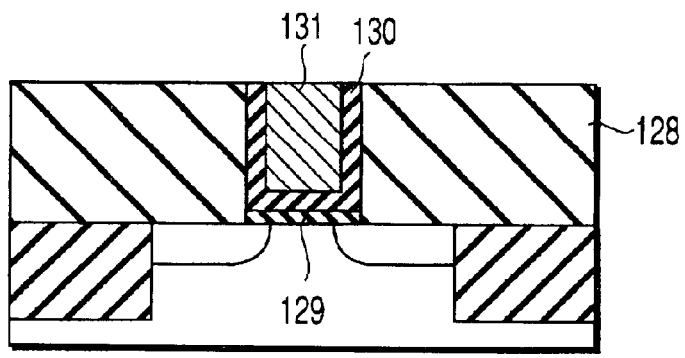

Next, as shown in FIG. 7F, a gate electrode material such as aluminum is deposited by CVD and subsequently flattened by CMP to form a gate electrode 131. After this, contacts and upper wirings are formed.

The fourth and fifth embodiments have been explained. However, these embodiments can also be modified as follows.

In the above embodiments, an atmosphere containing water vapor and hydrogen is used as an example of an atmosphere containing two kinds of gases having different oxidizing strength. However, the heat treatment in these atmospheres can also be applied in an atmosphere containing carbon monoxide (CO) and carbon dioxide (CO$_2$). In this case, carbon dioxide acts as an oxidant and carbon monoxide acts as a reductant.

Further, in the previous embodiments, a laminated structure of a silicon oxide-nitride film and metal oxide film is used as the gate insulating film, but a metal silicate film can also be used instead of the metal oxide film. Additionally, a single-layered film of a metal oxide film or metal silicate film can be used as the gate insulating film. Moreover, a laminated structure having a metal oxide film formed on the metal silicate film can also be used. In these instances, a dense metal oxide film or metal silicate film can be formed by applying heat treatment under an atmosphere containing two kinds of gases having different oxidizing strengths.

In these embodiments, gadolinium is used as a metal element contained in the metal oxide film, but it is sufficient if at least one of the metal elements is selected from the group consisting of zirconium, gadolinium, hafnium, lanthanum, yttrium, aluminum, and titanium and is contained in the metal oxide film or metal silicate film.

(Embodiment 6)

Embodiment 6 of the present invention will now be explained with reference to FIGS. 8A to 8C in the accompanying drawings. This embodiment directs to a method for forming a metal silicate film as a gate insulating film structure.

Figure 8A:
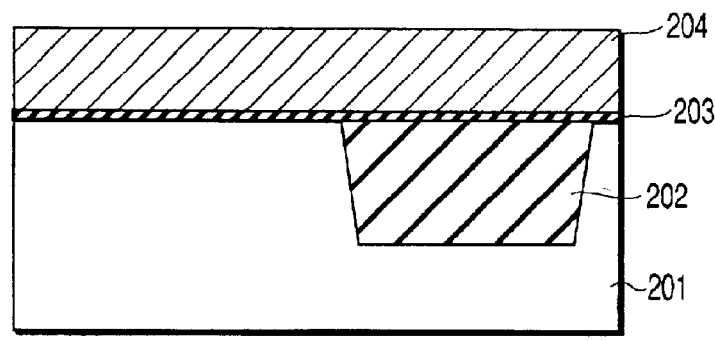
FIGS. 8A to 8C show cross sectional views of each of the main portions in each respective step of a manufacturing method of a semiconductor device according to a sixth embodiment of this invention.
Figure 8B:
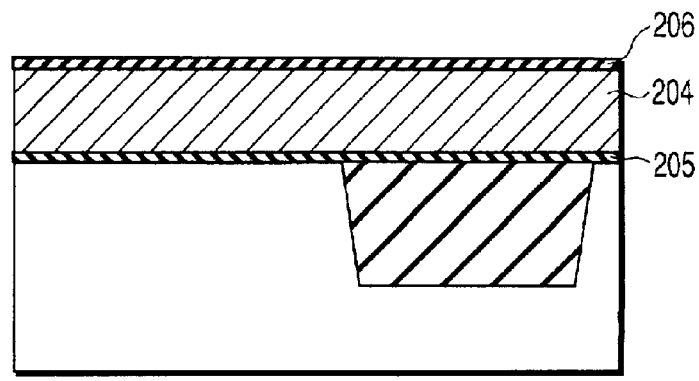
Figure 8C:
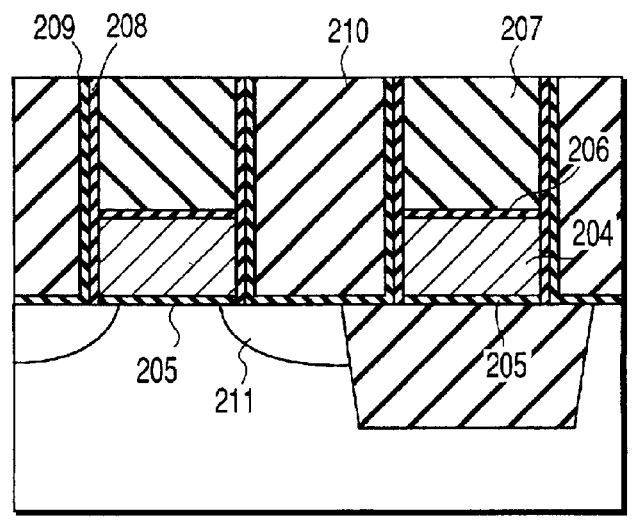

FIGS. 8A to 8C are cross section views of each respective steps of a manufacturing method of a semiconductor device according to embodiment 6 of the present invention.

First, as shown in FIG. 8A, an element isolation region 202 is formed in a silicon substrate 201. Then, a silicon oxide film 203 with a film thickness of approximately 2 nm is formed by either dry or wet oxidation. Further, a zirconium film with a film thickness of approximately 100 nm is formed as metal film 204 by plating or sputtering. If plating is used, zirconium film 204 is formed by applying electrolysis in a zirconium sulfate (Zr(SO$_4$)$_2$·4H$_2$O) solution after a layer of seed zirconium is formed. By plating, zirconium film 204 thus formed has a high controllability and productivity.

Second, as shown in FIG. 8B, heat treatment is applied in an inert gas atmosphere in order to avoid crystallization.

By applying heat treatment, oxidation/reduction reaction and mutual diffusion occur in the interface between silicon oxide film 203 and zirconium film 204 to form a zirconium silicate film 205 with a film thickness of approximately 4 nm (which corresponds to approximately 1 nm in terms of film thickness of silicon oxide film). It is known that an oxide film is formed on the surface of zirconium by using a small amount of oxygen and zirconium which is highly resistant to oxidation (for example, the first ionization potential $\Delta E$ of copper is approximately 7.73 (eV), but that of zirconium is approximately 6.84 (eV). Therefore, the surface of zirconium film 204 is easily oxidized in air and an oxidized-zirconium film 206 is formed.

When the surface of zirconium film 204 is oxidized to some extent, the oxidation does not further proceed and the internal portion of zirconium film 204 keeps the metal state in the heat treatment in a gentle condition. Therefore, the internal zirconium can be used as an electrode. Alternatively, zirconium oxide film 206 is removed by using sulfuric acid or hydrofluoric acid, zirconium film 204 is removed by using hydrogen peroxide solution or the like, and a new metal film is formed on zirconium silicate film 205, which was left behind. In this embodiment, when zirconium film 204 is not removed and used as an electrode is explained.

After zirconium silicate film 205 is formed, a silicon nitride film (SiN film) 207, which is a cap insulating film with a film thickness of approximately 200 nm is formed on the entire surface as shown in FIG. 8C. Then, silicon nitride film (SiN) 207, zirconium film 204 and the like are patterned into a gate electrode. Next, impurity is implanted ionically with gate electrode as a mask and the doped impurity is activated to form source and drain diffusion layer 211.

After this, silicon nitride (SiN) film 208 used as a spacer is formed and the substrate surface is exposed by RIE. Silicon nitride (SiN) film 209 acting as a liner layer and which is used as a barrier at the time of formation of a Boro Phospho Silicate Glass ("BPSG") film 210 and as a stopper at the time of the RIE process are formed to a film thickness of approximately 15 nm. Further, BPSG film 210 is formed and the density of BPSG film 210 is increased in a wet oxidation atmosphere at approximately 800° C. for about 30 minutes. Then, BPSG film 210 is flattened by using CMP with silicon nitride (SiN) films 207 to 209 being used as a stopper to complete the formation of a transistor.

Thus, according to this embodiment, since the zirconium film is formed on the silicon oxide film and the silicon oxide film and zirconium film react with each other by heat treatment to form the zirconium silicate film, the zirconium silicate film thus formed has an excellent film quality and a large dielectric constant which can then be used as the gate insulating film and the zirconium film which is left behind after the heat treatment can be used as is as gate electrode so that the manufacturing process can be simplified and the productivity enhanced.

(Embodiment 7)

FIGS. 9A to 9E are cross section views of respective steps of a manufacturing method of a semiconductor device according to embodiment 7 of the present invention. This embodiment uses methods explained in embodiment 6 to form a dual metal transistor having a gate electrode formed from different types of metals. The constituents corresponding to those of embodiment 6 are shown in FIGS. 8A to 8C and are denoted by the same reference numerals.

Figure 9A:
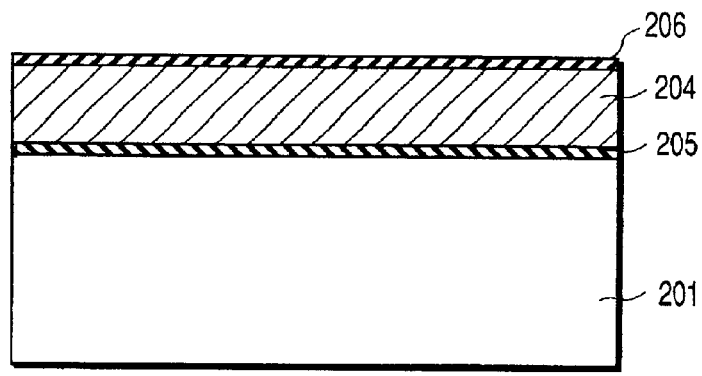
FIGS. 9A to 9E show cross sectional views of each of the main portions in each respective step of a manufacturing method of a semiconductor device according to a seventh embodiment of this invention.

Like the same process taught and disclosed in embodiment 6, zirconium film 204 is formed on silicon oxide film (not shown) and the heat treatment is applied to react with the silicon oxide film and zirconium film 204 and with each other to form a zirconium silicate film 205 as shown in FIG. 9A.

Figure 9B:
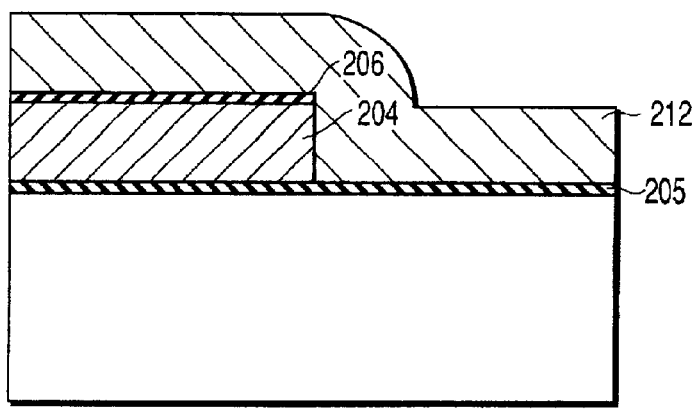

Then, as shown in FIG. 9B, part of zirconium film 204 is removed. Specifically, a resist pattern is formed on a region on which part of zirconium film 204 is to be left behind, zirconium oxide film 206 is removed by using sulfuric acid or hydrofluoric acid with the resist pattern as a mask and zirconium film 204 is removed by using hydrogen peroxide solution or the like. After this, an yttrium film 212 is formed to a film thickness of approximately 100 nm as a metal film different from a zirconium film on the entire surface.

Figure 9C:
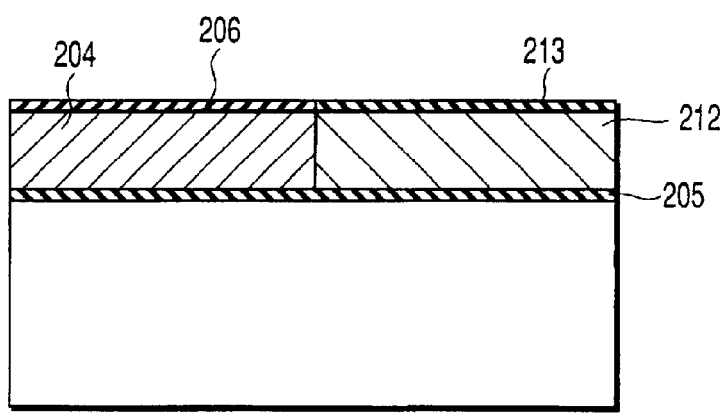

Next, as shown in FIG. 9C, the resultant structure is flattened by CMP method. A zirconium oxide film 206 is formed on the surface of the zirconium film 204 and a yttrium oxide film 213 is formed on the surface of the yttrium film 212 by exposing the substrate to an atmosphere. The first ionization potential ΔE of yttrium is approximately 6.38 (eV) and yttrium can be easily oxidized in air like zirconium.

Figure 9D:
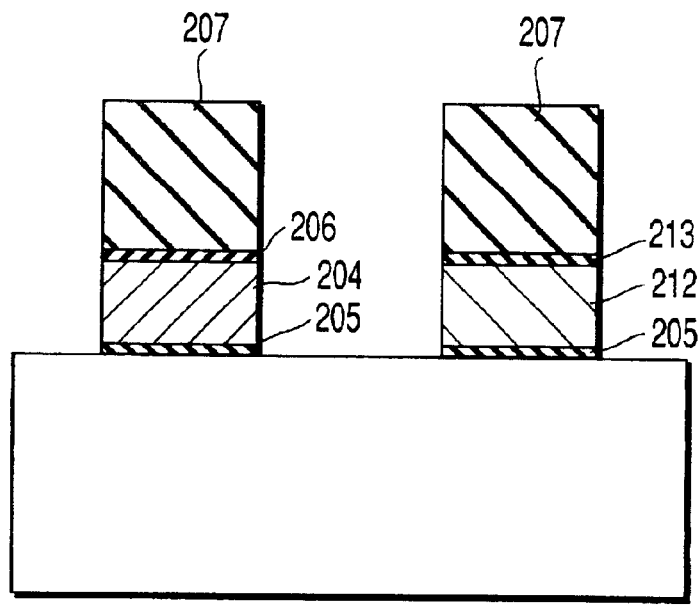

Next, as shown in FIG. 9D, a silicon nitride film 207 which is a cap insulating film is formed to a film thickness of approximately 200 nm. Then, silicon nitride film 207, zirconium film 204, yttrium film 212 and the like are patterned into a gate electrode.

Figure 9E:
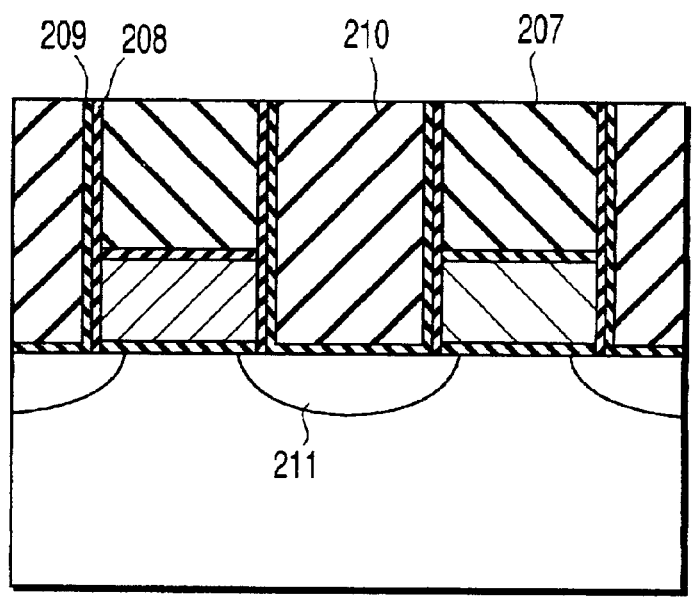

After this, like embodiment 6, source and drain diffusion layers 211, spacer silicon nitride (SiN) films 208, liner silicon nitride (SiN) films 209, BPSG films 210 and the like are formed to complete a transistor having a structure shown in FIG. 9E.

In this embodiment, when the dual metal transistor is formed, the metal silicate film having an excellent film quality and a large dielectric constant can be used as the gate insulating film, the manufacturing process can be simplified and the productivity thus can be enhanced.

(Embodiment 8)

FIGS. 10A to 10E are cross section views of respective steps of a manufacturing method of a semiconductor device according to embodiment 8 of the present invention. This embodiment utilizes the method explained in embodiment 7 to form a dual metal transistor having a gate electrode formed of different types of metals. The constituents corresponding to those of embodiment 6 are shown in FIGS. 8A to 8C and are assigned same reference numerals.

Figure 10A:
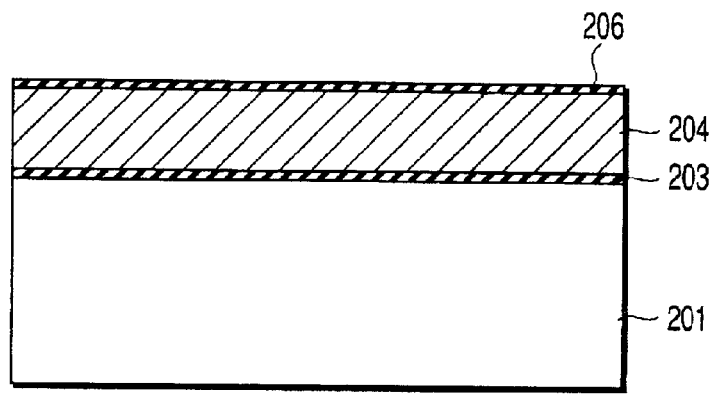
FIGS. 10A to 10E show cross sectional views of each of the main portions in each respective step of a manufacturing method of a semiconductor device according to an eighth embodiment of this invention.

First, like the process in embodiment 6, as shown in FIG. 10A, a zirconium film 204 is formed on a silicon oxide film 203 and a zirconium oxide film 206 is formed on zirconium film 204.

Figure 10B:
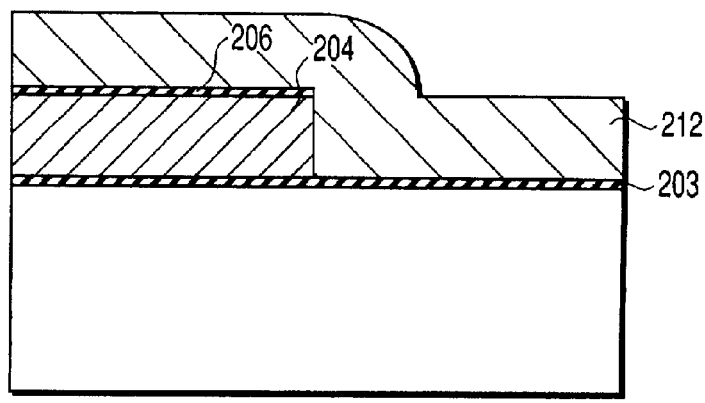

Next, as shown in FIG. 10B, part of zirconium film 204 is removed. More specifically, a resist pattern is formed on a region on which part of zirconium film 204 is to be left behind, zirconium oxide film 206 is removed by using sulfuric acid or hydrofluoric acid with the resist pattern as a mask and zirconium film 204 is removed by using hydrogen peroxide solution or the like. After this, an yttrium film 212 is formed to a film thickness of about 100 nm as a metal film different from a zirconium film on the entire surface.

Figure 10C:
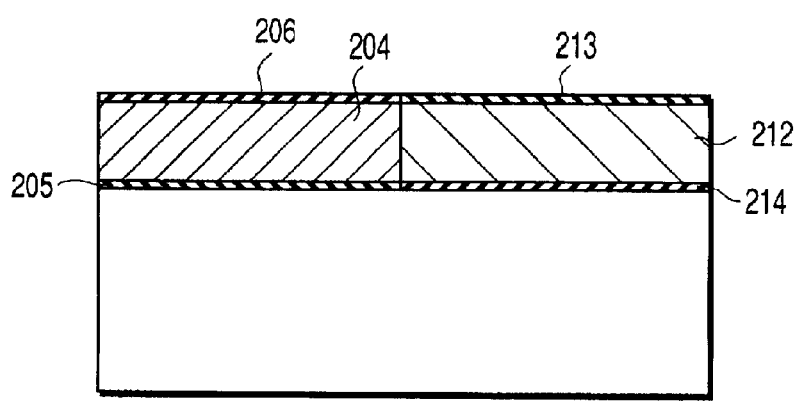

Next, as shown in FIG. 10C, the resultant structure is flattened by CMP. After this, heat treatment is applied in an inert gas atmosphere where crystallization will not occur. By applying heat treatment, oxidation/reduction reaction and mutual diffusion occur in the interface between silicon oxide film 203 and zirconium film 204 and in the interface between silicon oxide film 203 and yttrium film 212 to respectively form zirconium silicate film 205 and yttrium silicate film 214 with a film thickness of approximately 4 nm (which corresponds to approximately 1 nm in terms of the film thickness of a silicon oxide film). zirconium oxide film 206 is formed on the surface of zirconium film 204 and a yttrium oxide film 213 is formed on the surface of yttrium film 212 by exposing the substrate to an atmosphere.

Figure 10D:
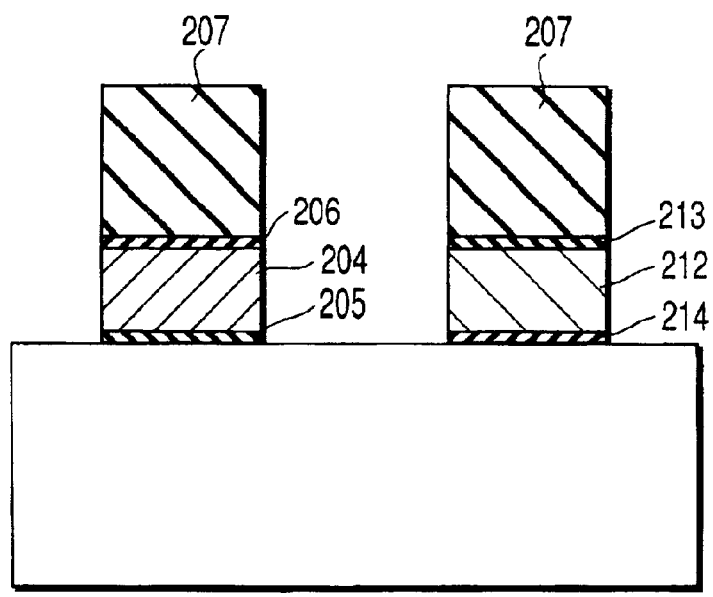

Next, as shown in FIG. 10D, silicon nitride film 207, which is a cap insulating film is formed to a film thickness of about 200 nm. Then, silicon nitride film 207, zirconium film 204, yttrium film 212 and the like are patterned into a gate electrode form.

Figure 10E:
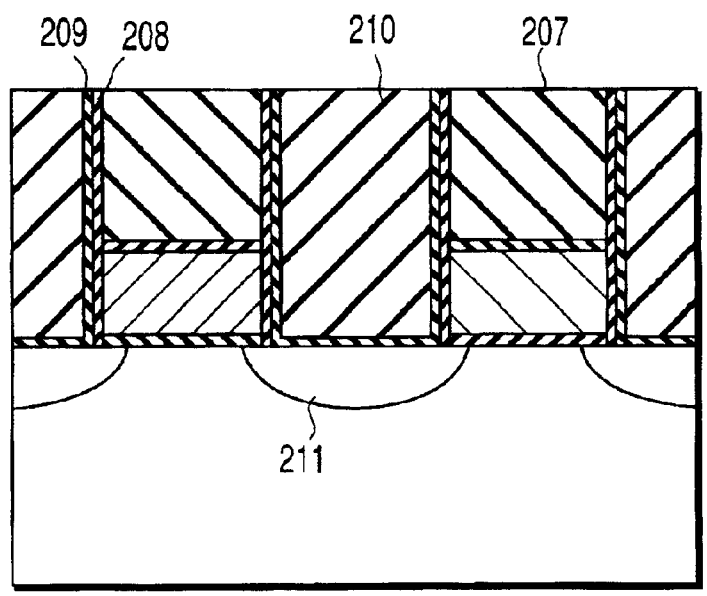

After this, like in embodiment 6, source and drain diffusion layers 211, space SiN films 208, liner SiN films 209, BPSG films 210 and the like are formed to complete a transistor having a structure shown in FIG. 10E.

Also, like embodiments 6 and 7, in embodiment 8, when dual metal transistor is formed, the metal silicate film has an excellent film quality and a large dielectric constant which can be used as gate insulating film, the manufacturing process thus can be simplified and the productivity enhanced.

In embodiments 6 to 8, zirconium and yttrium are taken as examples of metal elements contained in the metal silicate film, but it is sufficient if at least one of the metal elements are, but not limited to zirconium, gadolinium, hafnium, lanthanum, yttrium, aluminum and titanium is contained in the metal silicate film.

Further, in embodiments 6 to 8, a single-layered film of the metal silicate film is used as gate insulating film, but a laminated structure of the metal silicate film and a metal oxide film formed on the metal silicate film can be used. In this case, after the metal silicate film is formed by the heat treatment, a metal film which does not react and lies on the metal silicate film is removed and then a metal oxide film is formed thereon. As the metal oxide film, a film containing at least one of the above metal elements, tantalum oxide film or a bismuth-strontium-titanium oxide ("BSTO") film can be used.

However, in embodiments 6 to 8, the metal film is formed on the silicon oxide film, but it is not limited to the silicon oxide film. Thus any type of silicon oxide film series insulating film can be used and, for example, a metal film can be formed on a silicon oxide-nitride film (SiON film).

In addition, metal used for the gate electrode can be varied and, for example, a tungsten film can be used or a laminated structure of a titanium nitride (TiN) film which is a barrier metal and a tungsten film can also be used.

(Embodiment 9)

Embodiment 9 of the present invention will now be explained with reference to FIGS. 11A to 11C in the accompanying drawings.

Figure 11A:
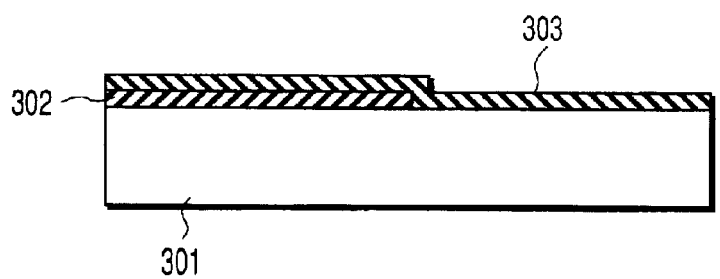
FIGS. 11A to 11C show cross sectional views of each of the main portions in each respective step of a manufacturing method of a semiconductor device according to a ninth embodiment of this invention.
Figure 11B:
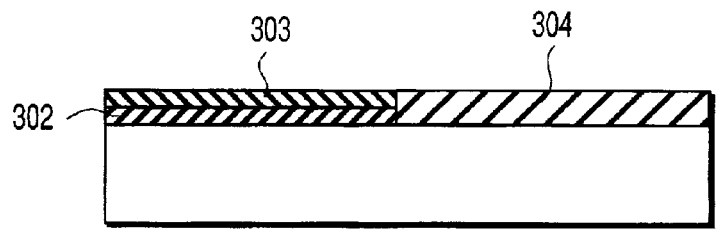
Figure 11C:
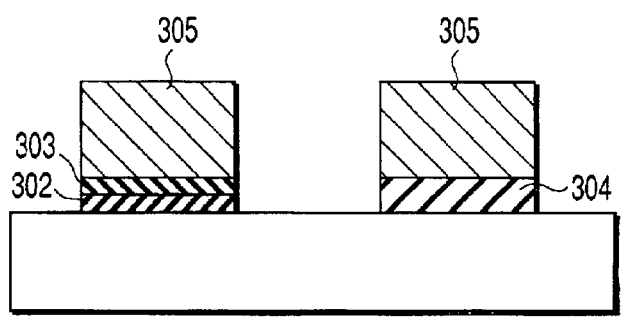

FIGS. 11A to 11C are cross section views of respective steps of a manufacturing method of a semiconductor device according to embodiment 9 of the present invention.

First, as shown in FIG. 11A, a silicon oxide film ($SiO_2$ film) 302 has an extremely small film thickness of approximately 1 nm or less is formed on silicon substrate 301. Then, part of silicon oxide film 302 is selectively removed to provide an area in which silicon oxide film 302 is formed on silicon substrate 301 and an area in which silicon oxide film 302 is not formed on silicon substrate 301. After this, a metal oxide film 303 containing metal from the group consisting of La, Hf, Zr, Gd or the like is deposited on the entire surface.

Next, as shown in FIG. 11B, the substrate having the above structure is subjected to heat treatment. By adequately selecting the conditions of the heat treatment, metal oxide film 303 reacts with silicon of silicon substrate 301 to form a metal silicate film 304 in the area in which silicon oxide film 302 is removed and a laminated layer of metal oxide film 303 and silicon oxide film 302 is left behind in the area in which silicon oxide film 302 is not removed.

Subsequently, as shown in FIG. 11C, an electrode film 305 for a gate electrode formed of titanium nitride (TiN) or the like is formed on the entire surface and then silicon oxide film 302, metal oxide film 303, metal silicate film 304, and electrode film 305 are patterned. Thus, gate electrode structures having gate insulating films whose effective film thicknesses are different from each other can be attained.

(Embodiment 10)

Figure 12A:
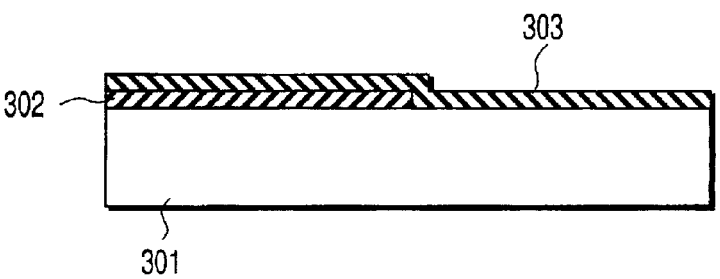
FIGS. 12A to 12C show cross sectional views of each of the main portions in each respective step of a manufacturing method of a semiconductor device according to a tenth embodiment of this invention.
Figure 12B:
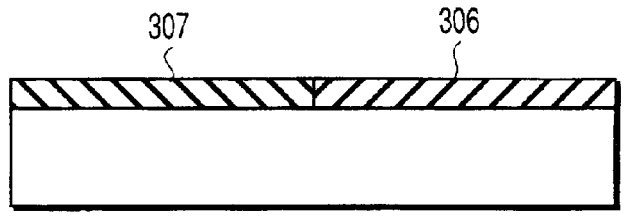
Figure 12C:
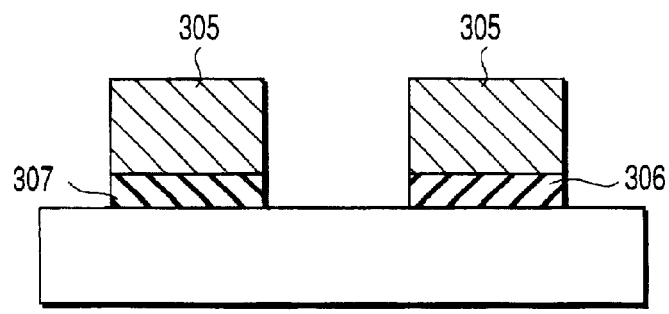

FIGS. 12A to 12C are cross section views of respective steps of a manufacturing method of a semiconductor device according to an embodiment 10 of the present invention.

Like embodiment 9, silicon oxide film 302 and metal oxide film 303 are formed on silicon substrate 301 as shown in FIG. 12A.

Next, as shown in FIG. 12B, the substrate having the above structure is subjected to heat treatment. By adequately selecting the conditions of the heat treatment, for example, by applying the heat treatment at a temperature higher than that of the heat treatment applied effected in embodiment 9, metal silicate films 306 and 307 having different compositions of a metal element, oxygen, and silicon can be formed in an area in which silicon oxide film 302 is removed and an area where silicon oxide film 302 is not removed. Metal silicate films 306 and 307 thus formed that the oxygen concentration is higher in metal silicate film 307 than in metal silicate film 306 and the silicon concentration is higher in metal silicate film 306 than in the metal silicate film 307.

After this, like embodiment 9, an electrode film 305 is formed and then silicon oxide films 306, 307 and electrode film 305 are patterned as shown in FIG. 12C. Thus, gate electrode structures having gate insulating films whose effective film thicknesses are different from each other can be attained.

(Embodiment 11)

Figure 13A:
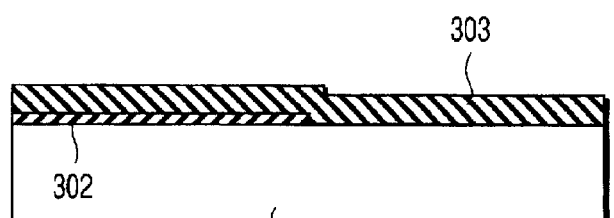
FIGS. 13A to 13C show cross sectional views of each of the main portions in each respective step of a manufacturing method of a semiconductor device according to an eleventh embodiment of this invention.
Figure 13B:
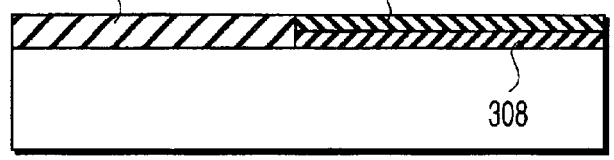
Figure 13C:
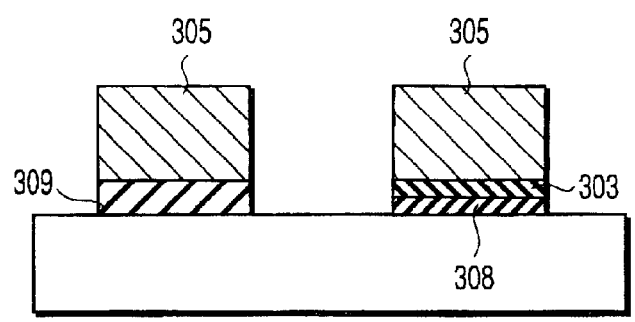

FIGS. 13A to 13C are cross sectional views of the respective steps of a manufacturing method of a semiconductor device according to embodiment 11 of the present invention.

As in embodiment 9, silicon oxide film 302 and metal oxide film 303 are formed on a silicon substrate 301 as shown in FIG. 13A. At this time, the oxygen concentration of metal oxide film 303 is set lower than a value determined by the stoichiometric ratio.

Next, as shown in FIG. 13B, the substrate having the above structure is subjected to heat treatment. By adequately selecting the conditions (heating temperature, heating time) of the heat treatment, with different insulation film structures film thicknesses of the silicon oxide film, composition ratios of the metal oxide film, and the like, can be formed in an area in which silicon oxide film 302 is removed and an area in which silicon oxide film 302 is not removed, respectively. In the area in which silicon oxide film 302 is removed, metal oxide film 303 reacts with silicon substrate 301 to form a metal silicate film 308 near the surface of silicon substrate 301 and thus a laminated structure of metal silicate film 308 and metal oxide film 303 is obtained. Further, in the area in which silicon oxide film 302 is not removed, metal oxide film 303 reacts with silicon oxide film 302 to form metal oxide film 309 having a composition which is close to the stoichiometric ratio.

After this, like embodiment 9, an electrode film 305 is formed and then metal silicate film 308, metal oxide films 303, 309, and electrode film 305 are patterned as shown in FIG. 13C. Thus, gate electrode structures having gate insulating films whose effective film thicknesses are different from each other can be formed.

(Embodiment 12)

Figure 14A:
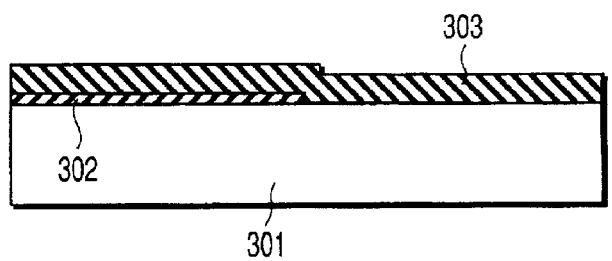
FIGS. 14A to 14C show cross sectional views of each of the main portions in each respective step of a manufacturing method of a semiconductor device according to a twelfth embodiment of this invention.
Figure 14B:
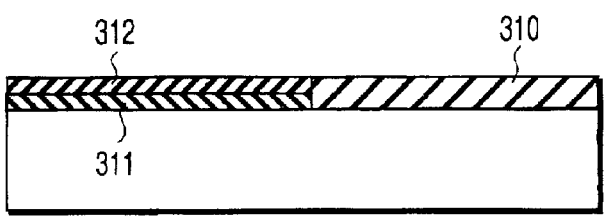
Figure 14C:
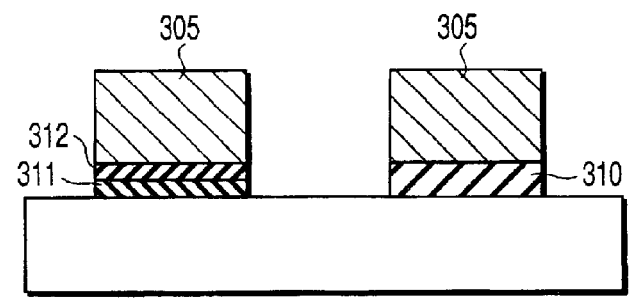

FIGS. 14A to 14C are cross section views of the respective steps of a manufacturing method of a semiconductor device according to embodiment 12 of the present invention.

Like embodiment 9, a silicon oxide film 302 and metal oxide film 303 are formed on silicon substrate 301 as shown in FIG. 14A. At this time, the oxygen concentration of metal oxide film 303 is set lower than a value determined by the stoichiometric ratio.

Next, as shown in FIG. 14B, the substrate having the above structure is subjected to heat treatment. By adequately selecting the conditions (i.e., heating temperature, heating time) of the heat treatment, with different insulating film structures, film thicknesses of the silicon oxide film, composition ratios of the metal oxide film, and the like, can be formed in an area in which silicon oxide film 302 is removed and an area where silicon oxide film 302 is not removed. In the area in which the silicon oxide film 302 is removed, metal silicate film 310 in which the composition ratio of silicon becomes higher in a portion closer to the surface of silicon substrate 301 is formed. Further, in the area in which silicon oxide film 302 is not removed, metal oxide film 312 having a composition close to the stoichiometric ratio is formed and a metal silicate film 311 is formed near the surface of silicon substrate 301.

After this, like embodiment 9, an electrode film 305 is formed and then metal silicate films 310, 311, metal oxide film 312, and electrode film 305 are patterned as shown in FIG. 14C. Thus, gate electrode structures having the gate insulating films whose effective film thicknesses are different from each other can be formed.

(Embodiment 13)

Figure 15A:
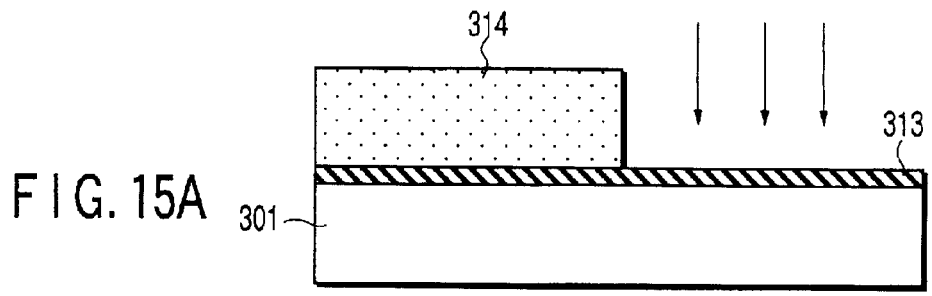
FIGS. 15A to 15C show cross sectional views of each of the main portions in each respective step of a manufacturing method of a semiconductor device according to a thirteenth embodiment of this invention.
Figure 15B:
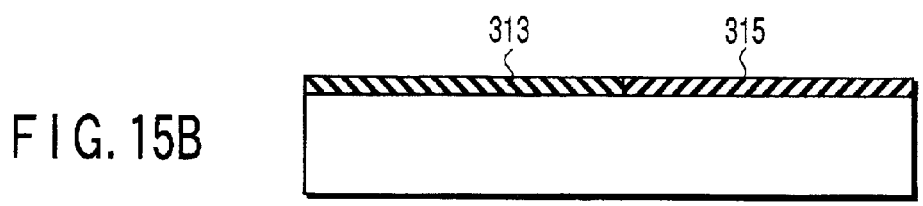
Figure 15C:
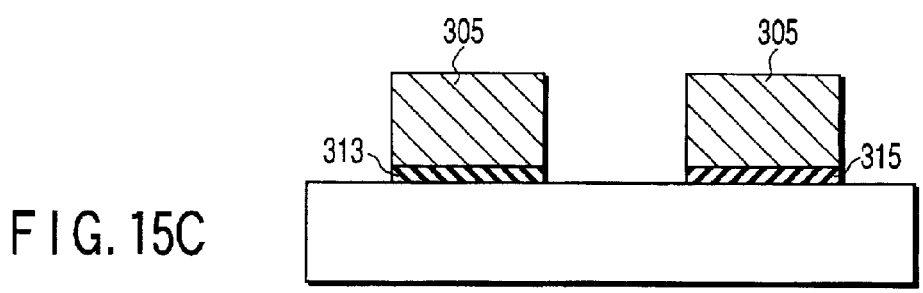

FIGS. 15A to 15C are cross section views of the respective steps of a manufacturing method of a semiconductor device according to embodiment 13 of this invention.

First, as shown in FIG. 15A, a metal oxide film 313 contains metals such as La, Hf, Zr, or Gd is deposited on silicon substrate 301. Then, silicon ion is doped into metal oxide film 313 by using an ion-implantation technique with photoresist 314 being the mask. The condition of the ion-implantation is thus set so that the range of the ion is to be within metal oxide film 313 and, for example, it is thus set so that the acceleration voltage is set to be approximately 0.5 to about 1 kev when the thickness of metal oxide film 313 is approximately 3 to 5 nm.

Next, as shown in FIG. 15B, photoresist 314 is removed by a plasma ashing process and wet process using an oxidizing medicine solution and then the heat treatment is applied. By heat treatment, in a region of metal oxide film 313 in which silicon is doped, metal oxide film 313 is converted into a metal silicate film 315 (for example, $La_2SiO_5$). In a region of metal oxide film 313 where silicon is not doped, metal oxide film 313 is left behind as is. Thus, by first doping the silicon ion in metal oxide film 313, it is possible to form metal silicate film 315 even if the temperature for heat treatment is set at a temperature lower than that of the heat treatment applied in embodiment 9.

Next, as in embodiment 9, an electrode film 305 is formed and then metal silicate film 315, metal oxide film 313, and electrode film 305 are patterned as shown in FIG. 15C. Thus, gate electrode structures having the gate insulating films whose effective film thicknesses are different from each other can be formed.

In the above example, metal oxide film 313 is deposited directly on silicon substrate 301, but it is possible to form a thin silicon oxide film on silicon substrate 301 and then deposit metal oxide film 313 on the silicon oxide film. In this case, the structure of the gate insulating film finally obtained is a laminated structure of the silicon oxide film and metal oxide film 313 and metal silicate film 315, respectively, in the region in which ion-implantation is not effected and the region in which ion-implantation is effected.

(Embodiment 14)

Figure 16A:
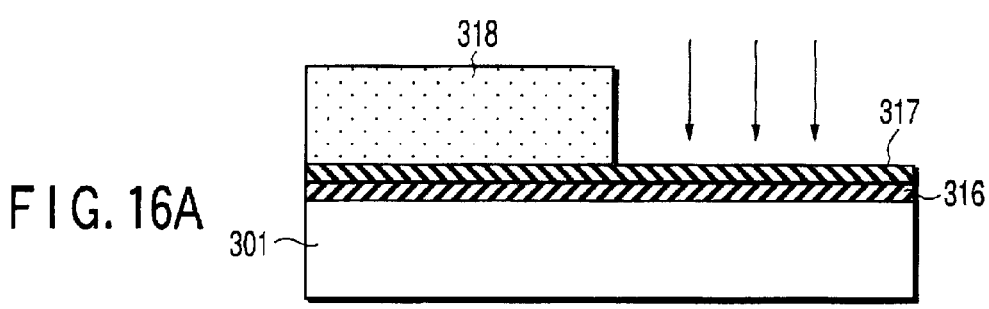
FIGS. 16A to 16C show cross sectional views of each of the main portions in each respective step of a manufacturing method of a semiconductor device according to a fourteenth embodiment of this invention.
Figure 16B:
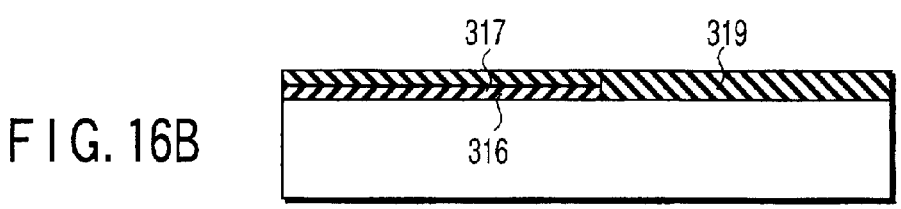
Figure 16C:
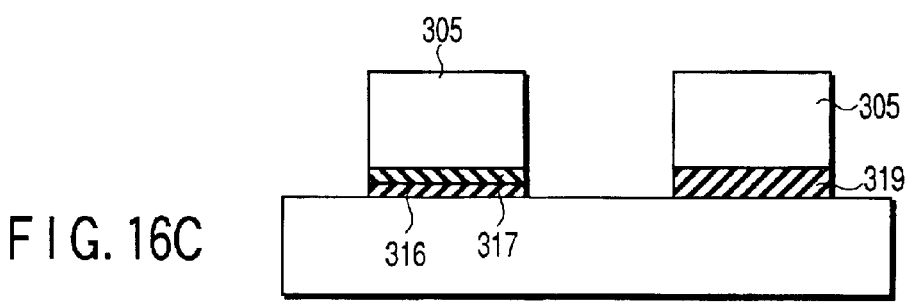

FIGS. 16A to 16C are cross section views of the respective steps of a manufacturing method of a semiconductor device according to embodiment 14 of the present invention.

First, as shown in FIG. 16A, an extremely thin silicon oxide film 316 with a film thickness of approximately 1 nm or less is formed on silicon substrate 301. Then, metal oxide film 317 containing metal, such as La, Hf, Zr, or Gd, is deposited on silicon oxide film 316. After this, an ion-implantation process for implanting ions such as Ar or Si ionically is applied with photoresist 318 as a mask. The condition of the ion-implantation is set so that the range of the ion is within silicon oxide film 316. Silicon oxide film 316 is then intentionally damaged by the ion-implantation.

Next, as shown in FIG. 16B, after photoresist 318 is removed, heat treatment is applied. By heat treatment in a region of silicon oxide film 316 that is damaged by the ion-implantation process, metal oxide film 317 and silicon oxide film 316 react with each other to form a metal silicate film 319. In a region where silicon oxide film 316 is not damaged, a laminated layer of silicon oxide film 316 and metal oxide film 317 is left behind. Since the coupling between silicon and oxygen is weakened by intentional damage given previously to silicon oxide film 316, it is possible to form metal silicate film 319 even if the temperature of the heat treatment is set at a lower temperature than that of the heat treatment temperature applied in embodiment 9.

Next, like embodiment 9, electrode film 305 is formed and then metal silicate film 319, metal oxide film 317, silicon oxide film 316, and electrode film 305 are patterned as shown in FIG. 16C. Thus, gate electrode structures having gate insulating films whose effective film thicknesses are different from each other can be formed.

As discusses, according to embodiments 9 to 14, the effective film thickness of the gate insulating film can be made smaller by using metal oxide film or metal silicate film as gate insulating film and the effective film thicknesses of gate insulating film can be made differently in a plurality of regions by making the structure of gate insulating film different in each respective region.

In embodiments 9 to 14, it is sufficient if at least one metal element is selected from the group consisting of Al, Sn, Sc, Ti, Sr, Y, Zr, Ba, La, Gd, Hf and Ta is contained in the metal oxide film or metal silicate film. However, in an example in which metal oxide film or metal silicate film is formed by reaction with the silicon oxide film, it is preferable to use a metal other than Sn and Ta among the above listed metal since Sn and Ta have a reduction property weaker than Si.

Further, in embodiments 9 to 14, the silicon oxide film is used as the silicon oxide film series insulating film formed on the silicon substrate. An example, silicon oxide-nitride film may be used as silicon oxide film series insulating film.

The embodiments of the invention have been explained above, but this invention is not limited to the above embodiments. For example, it is possible to properly combine the structures and manufacturing methods explained in all of the above embodiments taught and discloses. Further, this invention can be modified to a varying degree without departing from the technical scope thereof.

According to this invention, in a semiconductor device in which a metal oxide film or an insulating film containing metal, silicon and oxygen, for example, a metal silicate film, is used as a gate insulating film, the characteristic, reliability, productivity and the like are enhanced.

What is claimed is:

1. A semiconductor device comprising:

a semiconductor substrate;

a gate insulating film provided on said semiconductor substrate, at least part of said gate insulating film including a metal oxide film; and wherein an insulating film containing metal, silicon and oxygen is formed between said semiconductor substrate and said metal oxide film, said insulating film containing fluorine or fluorine and nitrogen and a main metal element constituting said metal oxide film and a main metal element constituting said insulating film containing metal, silicon and oxygen are different from each other.

2. A semiconductor device according to claim 1, wherein the semiconductor substrate is made of silicon.

3. A semiconductor device according to claim 1, wherein at least the metal oxide film is an amorphous film.

4. A semiconductor device according to claim 3, further comprising a flat insulating film having a gate opening portion in which the amorphous metal oxide film and the gate insulating film containing metal, silicon and oxygen are formed, and a gate electrode formed on the gate insulating film in the gate opening portion.

5. A semiconductor device comprising:

a semiconductor substrate, and first and second transistor regions formed on said semiconductor substrate, each of said first and second transistor regions having a gate insulating film at least a part of said gate insulating film including a metal oxide film;

wherein an insulating film containing metal, silicon and oxygen is formed between said semiconductor substrate and said metal oxide film, said insulating film provided in one of the first and second transistor regions contains fluorine or fluorine and nitrogen; and wherein a metal element constituting said insulating film containing metal, silicon and oxygen in one of said first and second regions is different from that of the metal oxide film and the composition rations of the metal elements, silicon and oxygen of said insulating films in said first and second regions are different from each other.

6. A semiconductor device comprising:

a semiconductor substrate;

a first transistor region on said semiconductor substrate, in which a first metal oxide film is provided as at least part of a first gate insulating film and a first insulating film containing metal, silicon and oxygen is provided between the semiconductor substrate and the first metal oxide film; and a second transistor region on said semiconductor substrate, in which a second metal oxide film is provided as at least part of a second gate insulating film and a second insulating film containing metal, silicon and oxygen is provided between the semiconductor substrate and the second metal oxide film, and a part of at least one of said first and second gate insulating films adjacent to the semiconductor substrate contains fluorine or fluorine and nitrogen;

wherein a metal element constituting the first or second metal oxide film in said first or second transistor region and that in the corresponding first or second insulating film are different from each other.

7. A semiconductor device according to claim 6, wherein the semiconductor substrate is made of silicon.

* * * * *